(12) United States Patent
Koltsidas et al.

(10) Patent No.: US 10,437,670 B1
(45) Date of Patent: Oct. 8, 2019

(54) METADATA HARDENING AND PARITY ACCUMULATION FOR LOG-STRUCTURED ARRAYS

(71) Applicant: International Business Machines Corporation, Armonk, NY (US)

(72) Inventors: Ioannis Koltsidas, Zurich (CH); Charles J. Camp, Sugar Land, TX (US); Nikolas Ioannou, Zurich (CH); Roman A. Pletka, Uster (CH); Antonios K. Kourtis, Zurich (CH); Sasa Tomic, Kilchberg (CH); Radu I. Stoica, Zurich (CH); Christopher Dennett, Houston, TX (US); Andrew D. Walls, San Jose, CA (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 15/988,889

(22) Filed: May 24, 2018

(51) Int. Cl.
  G11C 29/00 (2006.01)
  G06F 11/00 (2006.01)
  (Continued)

(52) U.S. Cl.
  CPC .......... *G06F 11/1068* (2013.01); *G06F 3/064* (2013.01); *G06F 3/0619* (2013.01);
  (Continued)

(58) Field of Classification Search
  CPC .... G06F 11/1068; G06F 3/0619; G06F 3/064; G06F 3/0656; G06F 3/0688; G11C 29/05
  (Continued)

(56) References Cited

U.S. PATENT DOCUMENTS

| | | |
|---|---|---|
| 5,537,534 A | 7/1996 | Voigt et al. |
| 6,738,863 B2 | 5/2004 | Butterworth et al. |

(Continued)

OTHER PUBLICATIONS

Menon, J., "A Performance Comparison of RAID-5 and Log-Structured Arrays," Proceedings of the 4th IEEE International Symposium on High Performance Distributed Computing, 1995, pp. 167-178.

(Continued)

*Primary Examiner* — Christine T. Tu
(74) *Attorney, Agent, or Firm* — Zilka-Kotab, P.C.

(57) ABSTRACT

A computer-implemented method, according to one embodiment, includes: receiving a write command to write data, the write command being received from a log structure array at a host location. The computer-implemented method also includes: extracting metadata information from the received write command; sequentially adding the extracted metadata information to a metadata buffer; extracting parity information from the received write command; adding the extracted parity information to a parity buffer; sending the data corresponding to the received write command to memory; determining whether an open segment in the memory which corresponds to the write command has been filled; updating the parity buffer with the metadata information included in the metadata buffer in response to determining that the open segment has been filled; and destaging the metadata information from the metadata buffer and parity information from the parity buffer to a physical storage location in the memory.

20 Claims, 11 Drawing Sheets

(51) Int. Cl.
*G06F 11/10* (2006.01)
*G11C 29/52* (2006.01)
*G06F 3/06* (2006.01)

(52) U.S. Cl.
CPC .......... *G06F 3/0656* (2013.01); *G06F 3/0688* (2013.01); *G11C 29/52* (2013.01)

(58) Field of Classification Search
USPC ....... 714/766, 767, 772, 758, 752, 799, 800, 714/807
See application file for complete search history.

(56) References Cited

U.S. PATENT DOCUMENTS

| | | | |
|---|---|---|---|
| 8,850,114 B2 | 9/2014 | Rosenband et al. | |
| 9,501,398 B2 | 11/2016 | George et al. | |
| 9,606,734 B2 | 3/2017 | Ioannou et al. | |
| 9,619,158 B2 | 4/2017 | Haas et al. | |
| 2011/0087837 A1* | 4/2011 | Blinick | G06F 11/1076 711/114 |
| 2011/0202792 A1* | 8/2011 | Atzmony | G06F 11/1076 714/6.24 |
| 2014/0164694 A1* | 6/2014 | Storer | G06F 11/1092 711/114 |

OTHER PUBLICATIONS

Koltsidas et al., U.S. Appl. No. 16/508,151, filed Jul. 10, 2019.
Koltsidas et al., U.S. Appl. No. 16/508,164, filed Jul. 10, 2019.

\* cited by examiner

METADATA HARDENING AND PARITY ACCUMULATION FOR LOG-STRUCTURED ARRAYS

BACKGROUND

The present invention relates to data storage systems, and more particularly, this invention relates to data storage system architectures that are able to increase data retention.

Using Flash memory as an example, the performance characteristics of conventional NAND Flash-based solid state drives (SSDs) are fundamentally different from those of traditional hard disk drives (HDDs). Data in conventional SSDs is typically organized in pages of 4, 8, or 16 KB sizes. Moreover, page read operations in SSDs are typically one order of magnitude faster than write operations and latency neither depends on the current nor the previous location of operations.

However, in Flash-based SSDs, memory locations are erased in blocks prior to being written to. The size of an erase block unit is typically 256 pages and the erase operations takes approximately one order of magnitude more time than a page program operation. Due to the intrinsic properties of NAND Flash, Flash-based SSDs write data out-of-place whereby a mapping table maps logical addresses of the written data to physical ones. This mapping table is typically referred to as the Logical-to-Physical Table (LPT).

As Flash-based memory cells exhibit read errors and/or failures due to wear or other reasons, additional redundancy may be used within memory pages as well as across memory chips. For example, Redundant Array of Independent Disks (RAID) schemes of differing levels (e.g., RAID-5 and RAID-6 like schemes) may be implemented. The additional redundancy within memory pages may include error correction code (ECC) which, for example, may include BCH codes. While the addition of ECC in pages is relatively straightforward, the organization of memory blocks into RAID-like stripes is more complex. For instance, individual blocks are retired over time which requires either reorganization of the stripes, or capacity reduction of the stripe. As the organization of stripes together with the LPT defines the placement of data, SSDs typically utilize a Log-Structured Array (LSA) architecture, which combines these two methods.

The LSA architecture performs out-of-place writes. In this approach, a memory page overwrite will result in writing the memory page data to a new location in memory, marking the old copy of the memory page data as invalid, and then updating the mapping information. Due to the limitations of current NAND memory technology, an invalidated data location cannot be reused until the entire block it belongs to has been erased. Before erasing, though, the block undergoes garbage collection, whereby any valid data in the block is relocated to a new block. Garbage collection of a block is typically deferred for as long as possible to maximize the amount of invalidated data in block, and thus reduce the number of valid pages that are relocated, as relocating data causes additional write operations, and thereby increases write amplification.

SUMMARY

A computer-implemented method, according to one embodiment, includes: receiving a write command to write data, the write command being received from a log structure array at a host location. The computer-implemented method also includes: extracting metadata information from the received write command; sequentially adding the extracted metadata information to a metadata buffer; extracting parity information from the received write command; adding the extracted parity information to a parity buffer; sending the data corresponding to the received write command to memory; determining whether an open segment in the memory which corresponds to the write command has been filled; updating the parity buffer with the metadata information included in the metadata buffer in response to determining that the open segment has been filled; and destaging the metadata information from the metadata buffer and parity information from the parity buffer to a physical storage location in the memory.

A computer program product, according to another embodiment, includes a computer readable storage medium having program instructions embodied therewith. The computer readable storage medium is not a transitory signal per se. Moreover, the program instructions readable and/or executable by a processor to cause the processor to perform a method which includes: receiving, by the processor, a write command to write data, the write command being received from a log structure array at a host location; extracting, by the processor, metadata information from the received write command; sequentially adding, by the processor, the extracted metadata information to a metadata buffer; extracting, by the processor, parity information from the received write command; adding, by the processor, the extracted parity information to a parity buffer; sending, by the processor, the data corresponding to the received write command to memory; determining, by the processor, whether an open segment in the memory which corresponds to the write command has been filled; updating, by the processor, the parity buffer with the metadata information included in the metadata buffer in response to determining that the open segment has been filled; and destaging, by the processor, the metadata information from the metadata buffer and the parity information from the parity buffer to a physical storage location in the memory.

A system, according to yet another embodiment, includes: an input/output controller; and logic integrated with and/or executable by the input/output controller, the logic being configured to: receive, by the input/output controller, a write command to write data, the write command being received from a log structure array at a host location. The logic is also configured to: extract, by the input/output controller, metadata information from the received write command; sequentially add, by the input/output controller, the extracted metadata information to a metadata buffer; extract, by the input/output controller, parity information from the received write command; add, by the input/output controller, the extracted parity information to a parity buffer; send, by the input/output controller, the data corresponding to the received write command to memory; determine, by the input/output controller, whether an open segment in the memory which corresponds to the write command has been filled; update, by the input/output controller, the parity buffer with the metadata information included in the metadata buffer in response to determining that the open segment has been filled; and destage, by the input/output controller, the metadata information from the metadata buffer and the parity information from the parity buffer to a physical storage location in the memory.

Other aspects and embodiments of the present invention will become apparent from the following detailed descrip-

DETAILED DESCRIPTION

Figure 1:
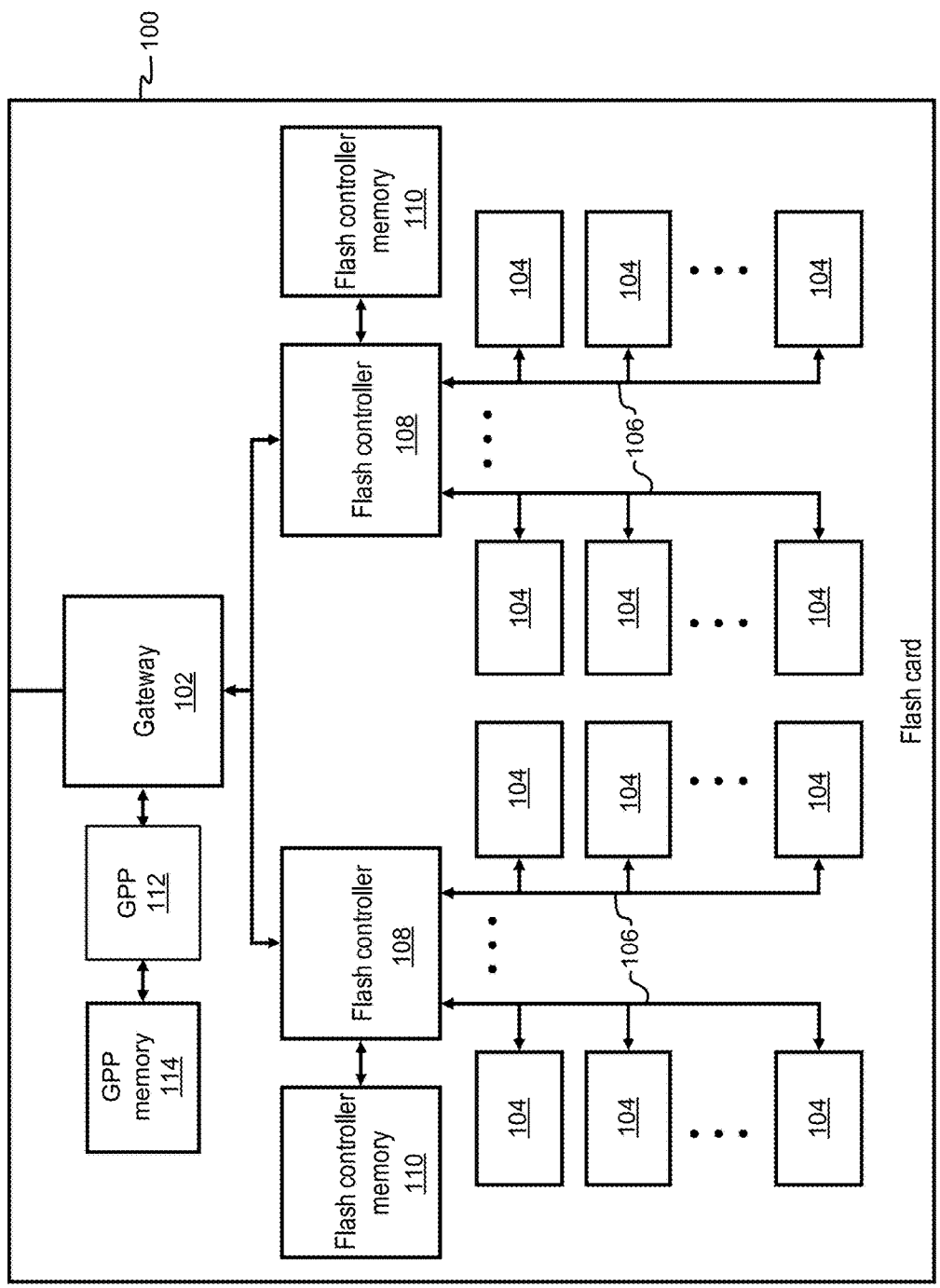
FIG. 1 is a diagram of a non-volatile memory card, in accordance with one embodiment.

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The following description discloses several preferred embodiments of data storage systems, as well as operation and/or component parts thereof which are able to achieve an efficient and accurate management of metadata and parity information for LSA data arrays such that durability and persistence of all user write operations is achieved. The embodiments included herein may even achieve data durability in the presence of arbitrary host failures, power loss, system crashes, etc. Moreover, these improvements are achieved while also implementing sequential write patterns for each of the respective LSA segments, as well as the ability to group all the metadata pages for the LSA segment contiguously in the physical space, e.g., as will be described in further detail below.

It should be appreciated that various embodiments herein can be implemented with a wide range of memory mediums, including for example non-volatile random access memory (NVRAM) technologies such as NAND Flash memory, NOR Flash memory, phase-change memory (PCM), magnetoresistive RAM (MRAM) and resistive RAM (RRAM). To provide a context, and solely to assist the reader, various embodiments may be described with reference to a type of non-volatile memory. This has been done by way of example only, and should not be deemed limiting on the invention defined in the claims.

In one general embodiment, a computer-implemented method includes: receiving a write command to write data, the write command being received from a log structure array at a host location. The computer-implemented method also includes: extracting metadata information from the received write command; sequentially adding the extracted metadata information to a metadata buffer; extracting parity information from the received write command; adding the extracted parity information to a parity buffer; sending the data corresponding to the received write command to memory; determining whether an open segment in the memory which corresponds to the write command has been filled; updating the parity buffer with the metadata information included in the metadata buffer in response to determining that the open segment has been filled; and destaging the metadata information from the metadata buffer and parity information from the parity buffer to a physical storage location in the memory.

In another general embodiment, a computer program product includes a computer readable storage medium having program instructions embodied therewith. The computer readable storage medium is not a transitory signal per se. Moreover, the program instructions readable and/or executable by a processor to cause the processor to perform a method which includes: receiving, by the processor, a write command to write data, the write command being received from a log structure array at a host location; extracting, by the processor, metadata information from the received write command; sequentially adding, by the processor, the extracted metadata information to a metadata buffer; extracting, by the processor, parity information from the received write command; adding, by the processor, the extracted parity information to a parity buffer; sending, by the processor, the data corresponding to the received write command to memory; determining, by the processor, whether an open segment in the memory which corresponds to the write command has been filled; updating, by the processor, the parity buffer with the metadata information included in the metadata buffer in response to determining that the open segment has been filled; and destaging, by the processor, the metadata information from the metadata buffer and the parity information from the parity buffer to a physical storage location in the memory.

In yet another general embodiment, a system includes: an input/output controller; and logic integrated with and/or executable by the input/output controller, the logic being configured to: receive, by the input/output controller, a write command to write data, the write command being received from a log structure array at a host location. The logic is also configured to: extract, by the input/output controller, metadata information from the received write command; sequentially add, by the input/output controller, the extracted metadata information to a metadata buffer; extract, by the input/output controller, parity information from the received write command; add, by the input/output controller, the extracted parity information to a parity buffer; send, by the input/output controller, the data corresponding to the received write command to memory; determine, by the input/output controller, whether an open segment in the memory which corresponds to the write command has been filled; update, by the input/output controller, the parity buffer with the metadata information included in the metadata buffer in response to determining that the open segment has been filled; and destage, by the input/output controller, the metadata information from the metadata buffer and the parity information from the parity buffer to a physical storage location in the memory.

FIG. 1 illustrates a memory card 100, in accordance with one embodiment. It should be noted that although memory card 100 is depicted as an exemplary non-volatile data storage card in the present embodiment, various other types of non-volatile data storage cards may be used in a data storage system according to alternate embodiments. It follows that the architecture and/or components of memory card 100 are in no way intended to limit the invention, but rather have been presented as a non-limiting example.

Moreover, as an option, the present memory card 100 may be implemented in conjunction with features from any other embodiment listed herein, such as those described with reference to the other FIGS. However, such memory card 100 and others presented herein may be used in various applications and/or in permutations which may or may not be specifically described in the illustrative embodiments listed herein. Further, the memory card 100 presented herein may be used in any desired environment.

With continued reference to FIG. 1, memory card 100 includes a gateway 102, a general purpose processor (GPP) 112 (such as an ASIC, FPGA, CPU, etc.) connected to a GPP memory 114 (which may comprise RAM, ROM, battery-backed Dynamic RAM (DRAM), phase-change memory PC-RAM, MRAM, STT-MRAM, etc., or a combination thereof), and a number of memory controllers 108, which include Flash controllers in the present example. Each memory controller 108 is connected to a plurality of NVRAM memory modules 104 (which may comprise NAND Flash or other non-volatile memory type(s) such as those listed above) via channels 106.

According to various embodiments, one or more of the controllers 108 may be or include one or more processors, and/or any logic for controlling any subsystem of the memory card 100. For example, the controllers 108 typically control the functions of NVRAM memory modules 104 such as, data writing, data recirculation, data reading, etc. The controllers 108 may operate using logic known in the art, as well as any logic disclosed herein, and thus may be considered as a processor for any of the descriptions of non-volatile memory included herein, in various embodiments.

Moreover, the controller 108 may be configured and/or programmable to perform or control some or all of the methodology presented herein. Thus, the controller 108 may be considered to be configured to perform various operations by way of logic programmed into one or more chips, modules, and/or blocks; software, firmware, and/or other instructions being available to one or more processors; etc., and combinations thereof.

Referring still to FIG. 1, each memory controller 108 is also connected to a controller memory 110 which preferably includes a cache which replicates a non-volatile memory structure according to the various embodiments described herein. However, depending on the desired embodiment, the controller memory 110 may be battery-backed DRAM, phase-change memory PC-RAM, MRAM, STT-MRAM, etc., or a combination thereof.

Figure 2:
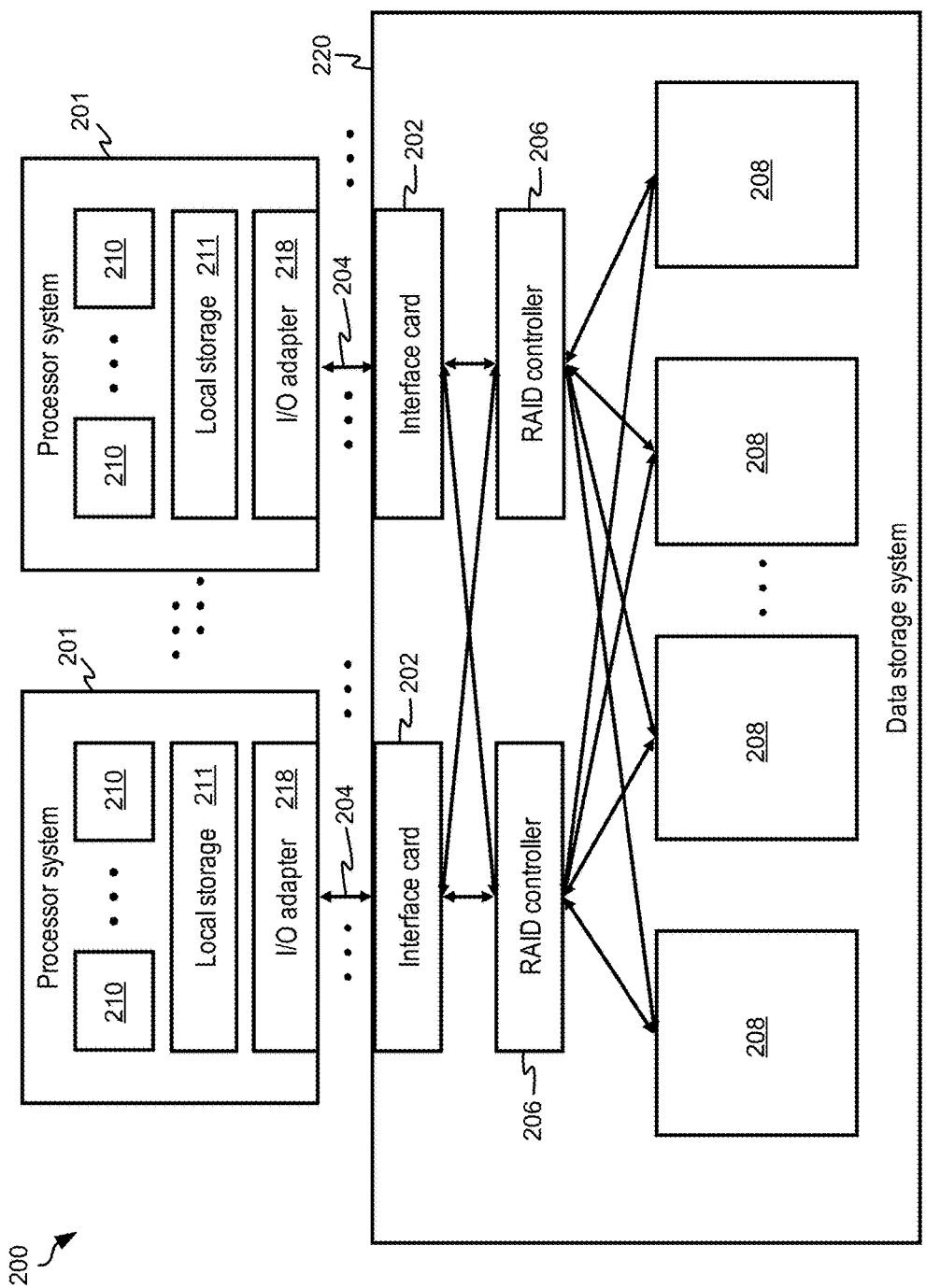
FIG. 2 is a diagram of a data storage system architecture, in accordance with one embodiment.

As previously mentioned, memory card 100 may be implemented in various types of data storage systems, depending on the desired embodiment. FIG. 2 illustrates a data storage system architecture 200 according to an exemplary embodiment which is in no way intended to limit the invention. Moreover, it should be noted that the data storage system 220 of FIG. 2 may include various components found in the embodiment of FIG. 1.

Looking to FIG. 2, the data storage system 220 comprises a number of interface cards 202 configured to communicate via input/output (I/O) interconnections 204 to one or more processor systems 201. The data storage system 220 may also comprise one or more RAID controllers 206 configured to control data storage in a plurality of non-volatile data storage cards 208. The non-volatile data storage cards 208 may comprise NVRAM, Flash memory cards, RAM, ROM, and/or some other known type of non-volatile memory.

The I/O interconnections 204 may include any known communication protocols, such as Fiber Channel (FC), FC over Ethernet (FCoE), Infiniband, Internet Small Computer System Interface (iSCSI), Transport Control Protocol/Internet Protocol (TCP/IP), Peripheral Component Interconnect Express (PCIe), etc., and/or any combination thereof.

The RAID controller(s) 206 in the data storage system 220 may perform a parity scheme similar to that employed by RAID-5, RAID-10, or some other suitable parity scheme, as would be understood by one of skill in the art upon reading the present descriptions.

Each processor system 201 comprises one or more processors 210 (such as CPUs, microprocessors, etc.), local data storage 211 (e.g., such as RAM 1214 of FIG. 12, ROM 1216 of FIG. 12, etc.), and an I/O adapter 218 configured to communicate with the data storage system 220.

Referring again to FIG. 1, memory controllers 108 and/or other controllers described herein (e.g., RAID controllers 206 of FIG. 2) may be able to perform various functions on stored data, depending on the desired embodiment. Specifically, memory controllers may include logic configured to perform any one or more of the following functions, which are in no way intended to be an exclusive list. In other words, depending on the desired embodiment, logic of a storage system may be configured to perform additional or alternative functions, as would be appreciated by one skilled in the art upon reading the present description.

Garbage Collection

Garbage collection in the context of SSD memory controllers of the present description may include the process of identifying blocks of data to be reclaimed for future usage and relocating all pages that are still valid therein. Moreover, depending on the specific controller and/or the respective garbage collection unit of operation, LEBs may be identified for being reclaimed and/or relocated. Typically, one LEB corresponds to one block stripe, but alternative implementations may consider a fixed number of block stripes building a LEB as well.

A physical "block" represents a minimal unit that may be erased on non-volatile memory, e.g., such as NAND Flash memory, and thereby prepared for writing data thereto. However, a typical garbage collection unit of operation is often a multiple of the physical blocks of non-volatile memory, and is also referred to herein as a LEB. This is due to the fact that typically RAID-like parity information is added in LEBs. Therefore, in case of a page or block failure data can only be rebuilt when all blocks in the LEB are still holding data. Accordingly, the individual blocks from the garbage collection unit can only be erased either individually or in a single unit once all still valid data from all blocks in the LEB has been relocated successfully to new locations. Hence, the full garbage collection units are garbage-collected as a single unit. Moreover, the size of the LEB directly affects the garbage collection induced write amplification. The larger the LEB, the more likely it becomes that unrelated data are stored together in the LEB, and therefore more of the LEB data may have to be relocated upon garbage collection selection.

Frequently, blocks from different dies and/or flash channels are grouped together, such that blocks from the same group can be read or written in parallel, thereby increasing overall bandwidth. It is also possible to combine the previous two methods, and to compose RAID stripes using blocks from different flash channels that can be accessed in parallel.

It should also be noted that an LEB may include any multiple of the physical memory block, which is a unit of physical erasure. Moreover, the organization of memory blocks into LEBs not only allows for adding RAID-like parity protection schemes among memory blocks from different memory chips, memory planes and/or channels but also allows for significantly enhancing performance through higher parallelism. For instance, multiple non-volatile memory blocks may be grouped together in a RAID stripe. As will be appreciated by one skilled in the art upon reading the present description, RAID schemes generally improve reliability and reduce the probability of data loss.

According to an exemplary embodiment, which is in no way intended to limit the invention, memory controllers (e.g., see 108 of FIG. 1) may internally perform a garbage collection. As previously mentioned, the garbage collection may include selecting a LEB to be relocated, after which all data that is still valid on the selected LEB may be relocated (e.g., moved). After the still valid data has been relocated, the LEB may be erased and thereafter, used for storing new data. The amount of data relocated from the garbage collected LEB determines the write amplification. Moreover, an efficient way to reduce the write amplification includes implementing heat segregation.

Heat Segregation

In the present context, the "write heat" of data refers to the rate (e.g., frequency) at which the data is updated (e.g., rewritten with new data). Memory blocks that are considered "hot" tend to have a frequent updated rate, while memory blocks that are considered "cold" have an update rate slower than hot blocks.

Tracking the write heat of a logical page may involve, for instance, allocating a certain number of bits in the LPT mapping entry for the page to keep track of how many write operations the page has seen in a certain time period or window. Typically, host write operations increase the write heat whereas internal relocation writes decrease the write heat. The actual increments and/or decrements to the write heat may be deterministic or probabilistic.

Similarly, read heat may be tracked with a certain number of additional bits in the LPT for each logical page. To reduce meta-data, read heat can also be tracked at a physical block level where separate counters per block for straddling and non-straddling reads can be maintained. However, it should be noted that the number of read requests to and/or read operations performed on a memory block may not come into play for heat segregation when determining the heat of the memory block for some embodiments. For example, if data is frequently read from a particular memory block, the high read frequency does not necessarily mean that memory block will also have a high update rate. Rather, a high frequency of read operations performed on a given memory block may denote an importance, value, etc. of the data stored in the memory block.

By grouping memory blocks of the same and/or similar write heat values, heat segregation may be achieved. In particular, heat segregating methods may group hot memory pages together in certain memory blocks while cold memory pages are grouped together in separate memory blocks. Thus, a heat segregated LEB tends to be occupied by either hot or cold data.

The merit of heat segregation is two-fold. First, performing a garbage collection process on a hot memory block will prevent triggering the relocation of cold data as well. In the absence of heat segregation, updates to hot data, which are performed frequently, also results in the undesirable relocations of all cold data collocated on the same LEB as the hot data being relocated. Therefore, the write amplification incurred by performing garbage collection is much lower for embodiments implementing heat segregation.

Secondly, the relative heat of data can be utilized for wear leveling purposes. For example, hot data may be placed in healthier (e.g., younger) memory blocks, while cold data may be placed on less healthy (e.g., older) memory blocks relative to those healthier memory blocks. Thus, the rate at which relatively older blocks are exposed to wear is effectively slowed, thereby improving the overall endurance of a given data storage system implementing heat segregation.

Write Allocation

Write allocation includes placing data of write operations into free locations of open LEBs. As soon as all pages in a LEB have been written, the LEB is closed and placed in a pool holding occupied LEBs. Typically, LEBs in the occupied pool become eligible for garbage collection. The number of open LEBs is normally limited and any LEB being closed may be replaced, either immediately or after some delay, with a fresh LEB that is being opened.

During performance, garbage collection may take place concurrently with user write operations. For example, as a user (e.g., a host) writes data to a device, the device controller may continuously perform garbage collection on LEBs with invalid data to make space for the new incoming data pages. As mentioned above, the LEBs having the garbage collection being performed thereon will often have some pages that are still valid at the time of the garbage collection operation; thus, these pages are preferably relocated (e.g., written) to a new LEB.

Again, the foregoing functions are in no way intended to limit the capabilities of any of the storage systems described and/or suggested herein. Rather, the aforementioned functions are presented by way of example, and depending on the desired embodiment, logic of a storage system may be configured to perform additional or alternative functions, as would be appreciated by one skilled in the art upon reading the present description.

Figure 3:
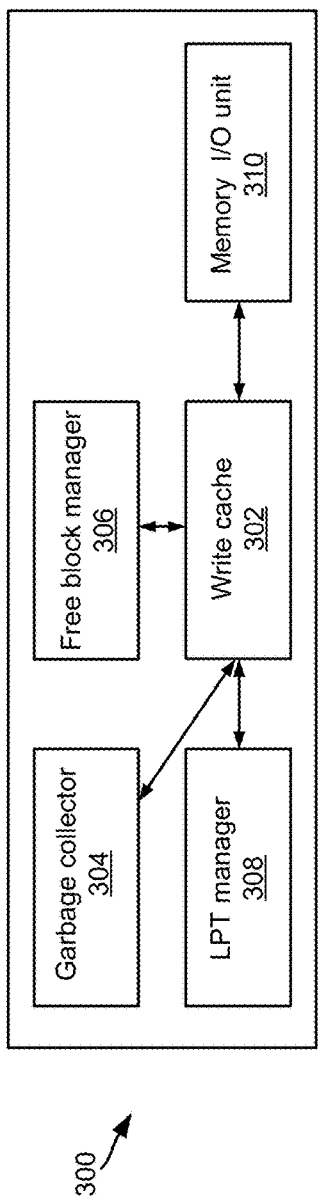
FIG. 3 is a system diagram, in accordance with one embodiment.

Referring now to FIG. 3, a system 300 is illustrated in accordance with one embodiment. As an option, the present system 300 may be implemented in conjunction with features from any other embodiment listed herein, such as those described with reference to the other FIGS. However, such system 300 and others presented herein may be used in various applications and/or in permutations which may or may not be specifically described in the illustrative embodiments listed herein. Further, the system 300 presented herein may be used in any desired environment, e.g., in combination with a controller.

As illustrated, system 300 includes a write cache 302 which is coupled to several other components, including garbage collector 304. As previously mentioned, garbage collector 304 may be used to free LEB units by relocating valid data and providing non-volatile memory blocks to be erased for later reuse. Thus, the garbage collector 304 may reclaim blocks of consecutive physical space, depending on the desired embodiment. According to an exemplary embodiment, block erase units may be used to keep track of and/or complete the erase of non-volatile memory blocks handed over by the garbage collector 304.

Write cache 302 is also coupled to free block manager 306 which may keep track of free non-volatile memory blocks after they have been erased. Moreover, as would be appreciated by one of ordinary skill in the art upon reading the present description, the free block manager 306 may build free stripes of non-volatile memory blocks from different lanes (e.g., block-stripes) using the erased free non-volatile memory blocks.

Referring still to FIG. 3, write cache 302 is coupled to LPT manager 308 and memory I/O unit 310. The LPT manager 308 maintains the logical-to-physical mappings of logical addresses to physical pages in memory. According to an example, which is in no way intended to limit the invention, the LPT manager 308 may maintain the logical-to-physical mappings of 4 KiB logical addresses. The memory I/O unit 310 communicates with the memory chips in order to perform low level operations, e.g., such as reading one or more non-volatile memory pages, writing a non-volatile memory page, erasing a non-volatile memory block, etc.

Figure 4:
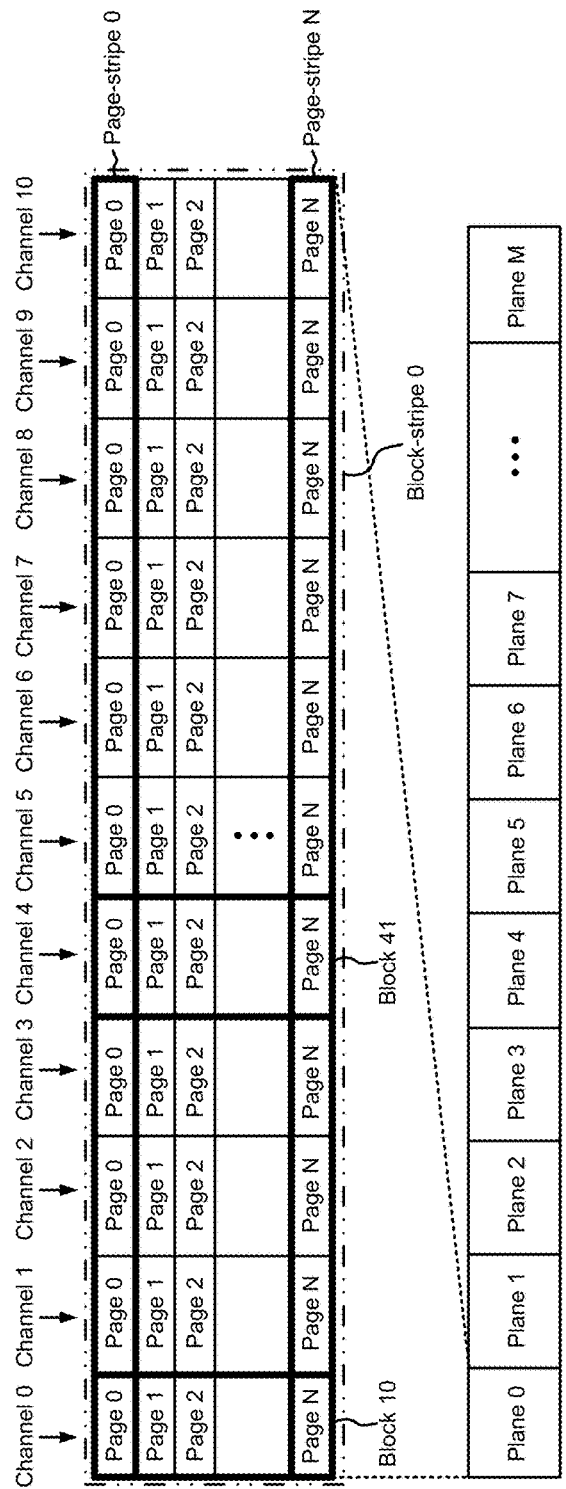
FIG. 4 is a conceptual diagram which includes a block-stripe and page-stripe, in accordance with one embodiment.

To better understand the distinction between block-stripes and page-stripes as used herein, FIG. 4 is a conceptual diagram 400, in accordance with one embodiment. LEBs are built from block stripes and typically a single block stripe is used to build a LEB. However, alternative embodiments may use multiple block stripes to form an LEB. As an option, the present conceptual diagram 400 may be implemented in conjunction with features from any other embodiment listed herein, such as those described with reference to the other FIGS. However, such conceptual diagram 400 and others presented herein may be used in various applications and/or in permutations which may or may not be specifically described in the illustrative embodiments listed herein. Further, the controller conceptual diagram 400 presented herein may be used in any desired environment. Thus, the exemplary non-volatile memory controller conceptual diagram 400 of FIG. 4 may be implemented in a cache architecture. However, depending on the desired embodiment, the conceptual diagram 400 of FIG. 4 may be implemented in defining the organization of data stored in non-volatile memory. Accordingly, both implementations are described in turn below.

Non-Volatile Memory

Looking now to FIG. 4, the conceptual diagram 400 includes a set of M+1 aggregated planes labeled "Plane 0" through "Plane M". An aggregated plane consists of all physical planes with the same plane index on different channels. It should be noted that aggregated planes are also referred to herein simply as planes.

When implemented with data stored in non-volatile memory, each physical plane on a channel may include a large set of blocks, e.g., typically in the order of 1024, 2048 or more. Moreover, one or more physical planes may also include several additional blocks which may be used as replacement blocks for bad blocks (e.g., blocks performing poorly, blocks having undesirable characteristics, etc.).

In each plane of non-volatile memory, a single block from each channel may form a respective block-stripe. It follows that a number of block-stripes supported by a given embodiment of non-volatile memory may be determined by the number of blocks per plane and the number of planes.

In the exploded view of Plane 0, the conceptual diagram 400 further illustrates a single block-stripe (Block-stripe 0) out of the set of block-stripes supported in the remainder of the planes. Block-stripe 0 of plane 0 is shown as including 11 blocks, one block from each channel labeled "Channel 0" through "Channel 10". It should be noted that the association of blocks to block-stripe can change over time as block-stripes are typically dissolved after they have been garbage collected. Erased blocks may be placed in free block pools, whereby new block-stripes are assembled from blocks in the free block pools when write allocation requests fresh block-stripes. For example, looking to conceptual diagram 400, Block 10 from Channel 0 and Block 41 from Channel 4 are currently associated with the illustrated Block-stripe 0 of Plane 0. Furthermore, the illustrated Block-stripe 0 holds N+1 page-stripes and each block therefore holds N+1 pages labeled "Page 0" through "Page N".

Cache Architecture

Referring still to FIG. 4, each block of pages illustrated in the exploded view of aggregated Plane 0 may constitute a unique block from one channel when implemented in a cache architecture. Similarly, each channel contributes a single, individual block which form a block-stripe. For example, looking to conceptual diagram 400, Block 10 from Channel 0 includes all pages (Page 0 through Page N) therein, while Block 41 from Channel 4 corresponds to all pages therein, and so on.

In the context of a memory controller, e.g., which may be capable of implementing RAID at the channel level, a block-stripe is made up of multiple blocks which amount to a stripe of blocks. Looking still to FIG. 4, the multiple blocks of aggregated Plane 0 constitute Block-stripe 0. While all blocks in a block-stripe typically belong to the same aggregated plane, in some embodiments one or more blocks of a block-stripe may belong to different physical planes. It follows that each aggregated plane may include one or more block-stripe. Thus, according to an illustrative embodiment, Block 0 through Block 10 from different physical planes may constitute a block-stripe.

Regardless of whether the conceptual diagram 400 of FIG. 4 is implemented with non-volatile memory and/or a cache architecture, in different embodiments, the number of pages in each block and/or the number of channels in each plane may vary depending on the desired embodiment. According to an exemplary embodiment, which is in no way intended to limit the invention, a block may include 256 pages, but could include more or less in various embodiments. Analogously, the number of channels per plane and/or the number of planes may vary depending on the desired embodiment.

Referring still to FIG. 4, all pages in a block-stripe with the same page index denote a page-stripe. For example, Page-stripe 0 includes the first page (Page 0) of each channel in Block-stripe 0 of Plane 0. Similarly, Page-stripe N includes the last page (Page N) of each channel in Block-stripe 0 of Plane 0.

As mentioned above, Flash-based SSDs write data out-of-place. Accordingly, a LPT is used to map logical addresses of the written data to physical addresses in memory. However, Flash-based SSDs may also implement sequential write patterns, such as those that result from LSA data organization. LSAs pack data into logical segments which are then appended to a global log structure that may span multiple devices. As write operations enter the system, the LSA packs the written data into large segments, each of which has a size which is typically a multiple of the logical erase block size of the underlying device. For instance, user read and write operations may have units which are 4 KB in size. When a segment is finally full, it is destaged to the SSD as a single sequential write operation. Thus, a LPT is used to keep track of which physical location corresponds to a given logical address.

Figure 5:
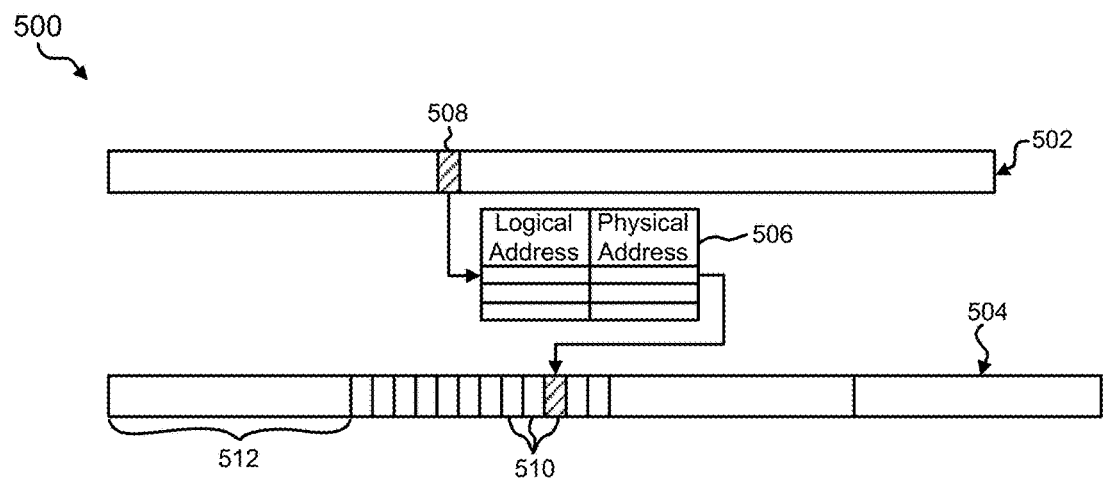
FIG. 5 is a partial representational view of a storage system, in accordance with one embodiment.

Referring momentarily to FIG. 5, a representative view of the relationship between logical and physical space in a storage system 500 is depicted in accordance with one embodiment. As an option, the present storage system 500 may be implemented in conjunction with features from any other embodiment listed herein, such as those described with reference to the other FIGS. However, such storage system 500 and others presented herein may be used in various applications and/or in permutations which may or may not be specifically described in the illustrative embodiments listed herein. Further, the storage system 500 presented herein may be used in any desired environment. Thus FIG. 5 (and the other FIGS.) may be deemed to include any possible permutation.

As shown, the storage system 500 includes logical space 502 and physical space 504 which are interconnected by a LPT 506. As mentioned above, the LPT 506 maps each of the logical addresses 508 in the logical space 502 to a physical address 510 in the physical space 504. Subsets of physical address 510 may also correspond to LSA segments 512.

When a user updates a previously stored page, the data is appended to the currently open segment at the first free (e.g., empty) page in that same segment. The LPT entry for the logical page is also updated to point to the new physical location, while the old version of the logical page (which had been stored in some other segment) is rendered invalid. Thus, when a user wants to read a stored logical page, the LPT is consulted to find the current physical location where the data is stored. The LPT may also be stored in DRAM memory in order to achieve fast access times.

LSAs may be implemented in various embodiments in order to achieve different results. For instance, LSAs may be implemented in order to avoid performing RAID read-modify-writes across the storage network, e.g., as would be appreciated by one skilled in the art after reading the present description. As a result, LSAs may increase performance, improve efficiency, reduce I/O amplification, etc. for the storage system. LSAs may also be implemented in order to reduce write amplification on memory, thereby further increasing performance and improving endurance. To achieve these improvements, LSAs remap logical pages as write operations are received to achieve a sequential fill pattern. Accordingly, logical data may be re-mapped at a LSAs page granularity which, e.g., may span from about 4 KB to about 32 KB, but may be higher or lower depending on the approach.

A LSA segment also includes metadata which may be used to identify which logical pages are included therein. Theoretically, the LSA metadata may also be placed in dedicated metadata segments. However, because the metadata is updated when data is being relocated upon garbage collection, co-locating it with the actual data is preferred. Typically, metadata includes a mapping entry for each logical page stored in a segment. According to an exemplary approach, the mapping entry may have the following form: [Physical address→Logical Address, Timestamp], where "Timestamp" is the timestamp of when the page was written. It should be noted that the timestamp does not necessarily reflect the time represented on a wall clock, but rather, it may also be a logical timestamp, e.g., a monotonically increasing counter that can be used to define a total order over all the mapping updates in the system. As this mapping is the reverse of the LPT, it may be referred to as "reverse mapping", while each metadata entry may be referred to as a "back-pointer".

It follows that the LSA segment is essentially an array of logical pages. Accordingly, the physical address included in a mapping entry is implied, and may be determined by the starting address of the segment, plus the offset of the physical page in the segment. Therefore, only the Logical Address and Timestamp from the mapping entry may be written for each logical page in the segment. Moreover, for approaches in which data is compressed, metadata may further include information about the compressed data size. However, in preferred approaches, the metadata entries for a given segment are grouped together in one or more physical pages of the segment. These metadata pages may either be dispersed among the data pages in the segment, or stored together at the end of the segment.

The metadata is desirable, as it serves two main purposes. First, upon system start-up the LSA system may simply read the metadata pages to re-construct the LPT mapping in the main memory. Second, when a segment is picked for garbage collection, each back-pointer may be compared with the corresponding entry for that logical page in the LPT. This comparison may determine whether the page is still valid, or if the logical page has been updated and may thereby be safely deleted.

Each metadata page may also have a checksum of all the metadata entries included therein which may be used for integrity checking purposes. Additionally, a segment may be prepended by an appropriate header which identifies the segment in the system, and includes all the configuration information involved with the LSA understanding the format of the data included in the segment. Finally, the last metadata page written for a segment may include a checksum that incorporates elements from the segment header as well as the timestamp of that last metadata page. This enables the system to determine, upon start-up, whether a given segment was closed properly before the system was shutdown.

Figure 6:
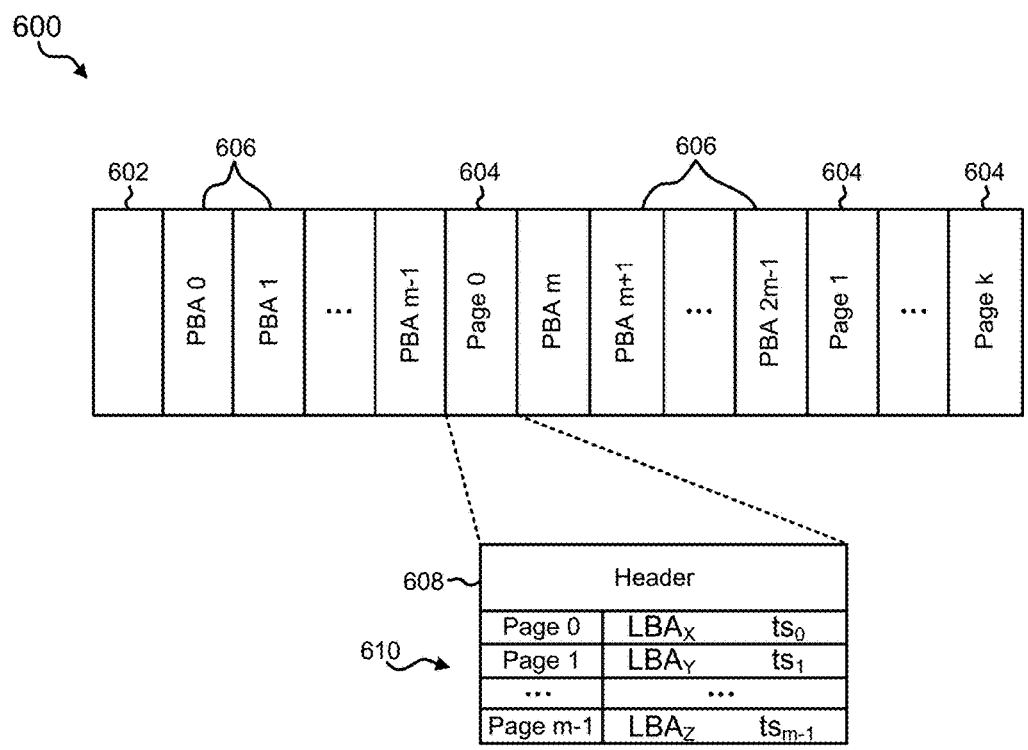
FIG. 6 is a representative view of the metadata corresponding to a LSA segment, in accordance with one embodiment.

Looking to FIG. 6, a representative view of the metadata 600 corresponding to a LSA segment is illustrated in accordance with one embodiment. As an option, the present metadata 600 may be implemented in conjunction with features from any other embodiment listed herein, such as those described with reference to the other FIGS., such as FIG. 5. However, such metadata 600 and others presented herein may be used in various applications and/or in permutations which may or may not be specifically described in the illustrative embodiments listed herein. Further, the metadata 600 presented herein may be used in any desired environment. Thus FIG. 6 (and the other FIGS.) may be deemed to include any possible permutation.

As shown, the metadata 600 includes a header 602 as well as metadata pages 604 which are separated by physical block addresses (PBA) 606. According to an illustrative approach, the metadata header 602 may have a size of 4 KiB. Moreover, the header 602 may include various information, e.g., such as segment configuration parameters, segment checksums, a segment timestamp, host information, an allocation timestamp, volume information, extent information, etc. Each of the metadata pages 604 may also have a header 608 which includes checksum information in addition to an array 610. As illustrated, the array 610 includes block pointer information ($LBA_X$, $LBA_Y$, ..., $LBA_Z$) and a timestamp ($ts_0$, $ts_1$, ..., $ts_{m-1}$) for each of the pages which correspond thereto.

However, conventional storage systems have a hard limit on achievable performance. This is due, in part, to the fact that these conventional systems implement the storage functionalities in a storage controller which has performance limitations. Accordingly, conventional products have been unable to further increase performance. Moreover, conventional products are vulnerable to data loss resulting from failure events which occur before a write request can be fully performed. For instance, conventional products accumulate data in the host memory before sending full segments of data to be written to memory. However, data stored in host memory may be lost as a result of experiencing such failure events, e.g., such as a power loss at the host location, a system crash, a network crash, etc.

In sharp contrast, various ones of the embodiments included herein are able to overcome the conventional performance limitations, thereby achieving performance levels that are significantly higher than previously possible. Moreover, these improvements to performance may be achieved in addition to increasing data retention and security, e.g., as will be described in further detail below.

Figure 7A:
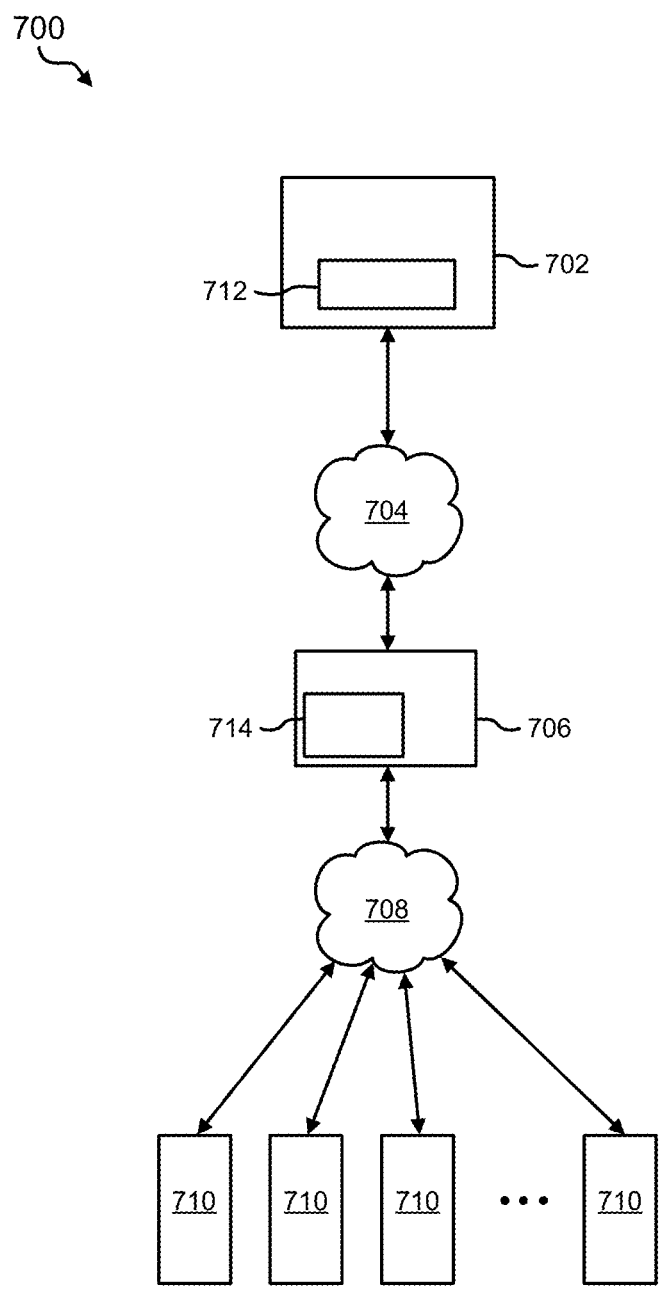
FIG. 7A-7C are partial representational views of a storage system, in accordance with one embodiment.
Figure 7B:
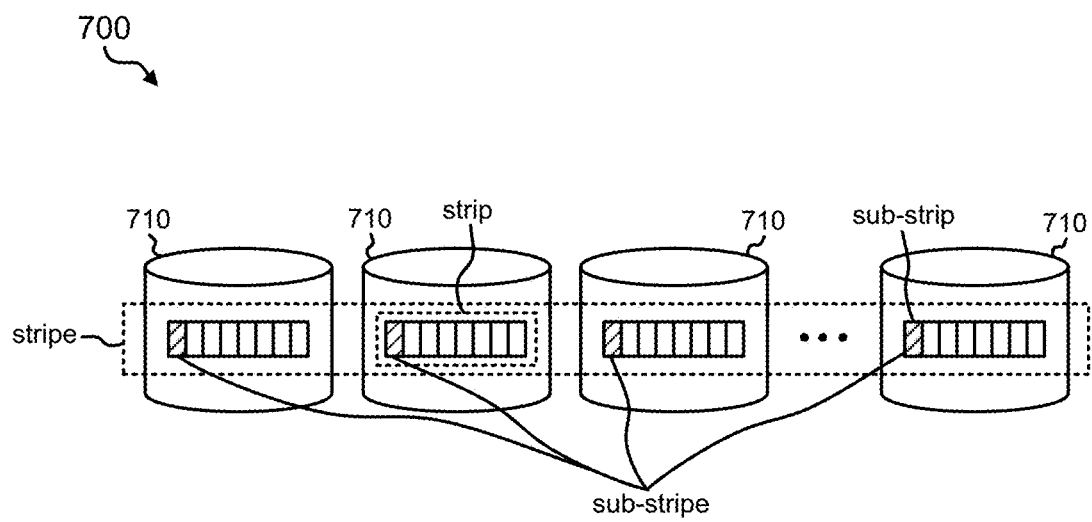
Figure 7C:
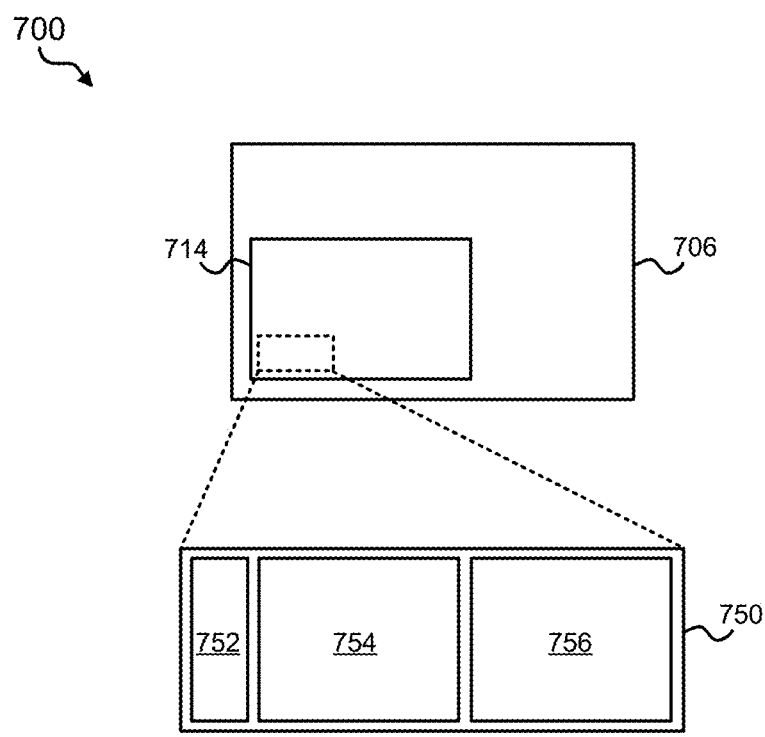

Referring now to FIGS. 7A-7C, a representative view of the architecture of a storage system 700 is illustrated in accordance with one embodiment. As an option, the present storage system 700 may be implemented in conjunction with features from any other embodiment listed herein, such as those described with reference to the other FIGS., such as FIGS. 5-6. However, such storage system 700 and others presented herein may be used in various applications and/or in permutations which may or may not be specifically described in the illustrative embodiments listed herein. Further, the storage system 700 presented herein may be used in any desired environment. Thus FIGS. 7A-7C (and the other FIGS.) may be deemed to include any possible permutation.

As shown in FIG. 7A, the storage system 700 includes a host 702 which is coupled to an I/O controller 706 by a network 704. I/O controller 706 is also connected to a plurality of storage drives 710 by a second network 708. Depending on the approach, the network 704 and/or the second network 708 may include any desired type of network, e.g., including a local area network (LAN), a wide area network (WAN), a storage area network (SAN), etc. However, it should be noted that the configuration depicted in FIG. 7A is in no way intended to limit the invention. In different approaches the various components included in the storage system 700 may or may not be positioned in a same physical enclosure, located at a same geographic location, etc. Thus, any of the host 702, the I/O controller 706, and the storage drives 710 may be coupled to each other using a wireless connection, e.g., WiFi, Bluetooth, a cellular network, etc.; a wired connection, e.g., a cable, a fiber-optic link, a wire, etc.; etc., or any other type of connection which would be apparent to one skilled in the art after reading the present description. In still other approaches, the network 704 and the second network 708 may be implemented as a single network that connects the various components in storage system 700.

Referring still to FIG. 7A, the host 702 includes a LSA component 712. Accordingly, the LSA component 712 may process host write data in order to achieve LSA data organization, e.g., as described above. However, memory at the host location may not be protected against failure events, e.g., such as host crashes, power failures, etc. Therefore, to ensure the durability of user write operations, the LSA component 712 preferably does not accumulate data in the host memory before sending full segments of data to the storage drives 710. Rather, the LSA component 712 remaps each write request to the appropriate physical location and immediately destages the data to that location. Accordingly, the LSA component may send one or more commands to the storage drives 710, instructing a new segment be opened in memory to store the data corresponding to one or more new write requests. Although this results in a higher number of smaller write requests compared to the situation in which the entire segment is destaged using a single command, the remapping process is beneficial in terms of the write amplification savings achieved in the storage drives 710. This is because the resulting data invalidation pattern at the physical level is the same, irrespective of whether the segment was written with one or more write requests.

Accordingly, write data may be sent from the host 702 (e.g., from the LSA component 712) to the I/O controller 706. Upon receiving the write data, the I/O controller 706 may perform additional data processing operations before the write data is finally sent to the storage drives 710 to be stored. For example, the I/O controller 706 may perform any one or more of the processes included in method 800 below. Accordingly, the I/O controller 706 may include a relatively small amount of protected memory 714, e.g., such as a battery-backed DRAM, or other types of NVRAM. The I/O controller 706 may also be capable of computing parity information for the desired erasure coding scheme. In other words, the I/O controller 706 may include an XOR engine which is compatible with different RAID schemes. However, in other approaches, the parity information may be computed elsewhere, e.g., such as by the storage drives 710.

In preferred approaches, the storage drives 710 are SSDs. Accordingly, the LSA may be constructed on top of an array of SSDs. However, the storage drives 710 may include any type of storage medium depending on the approach. In some approaches, the LSA may also add erasure coding for fault tolerance. It should be appreciated that various embodiments herein may be implemented with a wide range of RAID-like schemes, including for example RAID-4, RAID-5, RAID-6, etc. To provide a context, and solely to assist the reader, various embodiments may be described with reference to a RAID-5 scheme. This has been done by way of example only, and should not be deemed limiting on the invention.

As mentioned above, a LSA based segment may be opened in memory to store data corresponding to write requests received. Depending on the approach, the segment may correspond to one or more RAID stripes. However, looking to FIG. 7B, for ease of explanation, a LSA segment is illustrated as mapping to precisely one RAID "stripe". Moreover, the chunk of data that a RAID stripe stores on a given drive is referred to as a "strip". For example, in an array having 4 drives with a strip size of 64 KB, the size of one stripe would be 256 KB. Furthermore, the collection of pages that are stored in the same offset across all strips is referred to as a "sub-stripe". Furthermore, each of the pages in the sub-stripe are referred to as "sub-strip". It follows that the parity for each sub-stripe may be computed and written independently of all other sub-stripes.

With continued reference to FIGS. 7A-7B, it is again noted that the I/O controller 706 may include at least some protected memory 714, e.g., such as a battery-backed DRAM or other type of NVRAM. A portion of the protected memory 714 in the I/O controller 706 may be allocated for each segment which is opened (e.g., identified) to perform write operations in the storage drives 710. In other words, the process of transferring a write request from the host location to the I/O controller 706 may involve (e.g., be prefaced by) allocating memory space (e.g., a buffer) on the protected memory 714 of the I/O controller 706.

In some approaches, the allocation of the protected memory 714 may even be performed by the LSA component 712 itself, e.g., as would be appreciated by one skilled in the art after reading the present description. For instance, the LSA component 712 may send a request to the I/O controller 706, the request allocating memory space on the protected memory 714 of the I/O controller 706 for a newly opened segment in the storage drives 710. Thereafter, the allocated memory space (e.g., buffer) on the protected memory 714 of the I/O controller 706 may be used to store different types of information received with future write requests.

For instance, the memory space (e.g., buffer) allocated on the protected memory 714 for an open segment may store the cumulative parity of all the data that has been written so far to the open segment. The memory space (e.g., buffer) allocated on the protected memory 714 for an open segment may also store the collection of all metadata entries (e.g., back-pointers) for the data pages that have been written so far into the segment. In still further approaches, the memory space (e.g., buffer) allocated on the protected memory 714 for an open segment may store a short description of the logical identifier for the segment. The short description may correspond to the information stored in the segment header and may include the storage pool and/or volume to which the segment belongs, the segment ID, configuration parameters, the RAID stripe in the segment (if the LSA segment includes multiple RAID stripes), etc. The information included in the memory space is preferably able to enable the I/O controller 706 to destage both the metadata pages and the parity to the appropriate physical location in the storage drives 710 when appropriate to do so.

Looking to FIG. 7C, the logical structure of memory space (e.g., a buffer) 750 allocated on the protected memory 714 for an open segment is illustrated in accordance with an exemplary embodiment, which is in no way intended to limit the invention. As shown, the allocated memory space 750 includes a header 752, a parity accumulation buffer 754, and a metadata accumulation buffer 756. The header 752 may store information which links the specific allocated memory space 750 to the corresponding open segment in the storage drives. Moreover, the parity accumulation buffer 754 may be used to store the parity information corresponding to the write requests received which are directed to the open segment. The metadata accumulation buffer 756 may also be used to store the metadata corresponding to the write requests received which are directed to the open segment, e.g., as will be described in further detail below.

Figure 8:
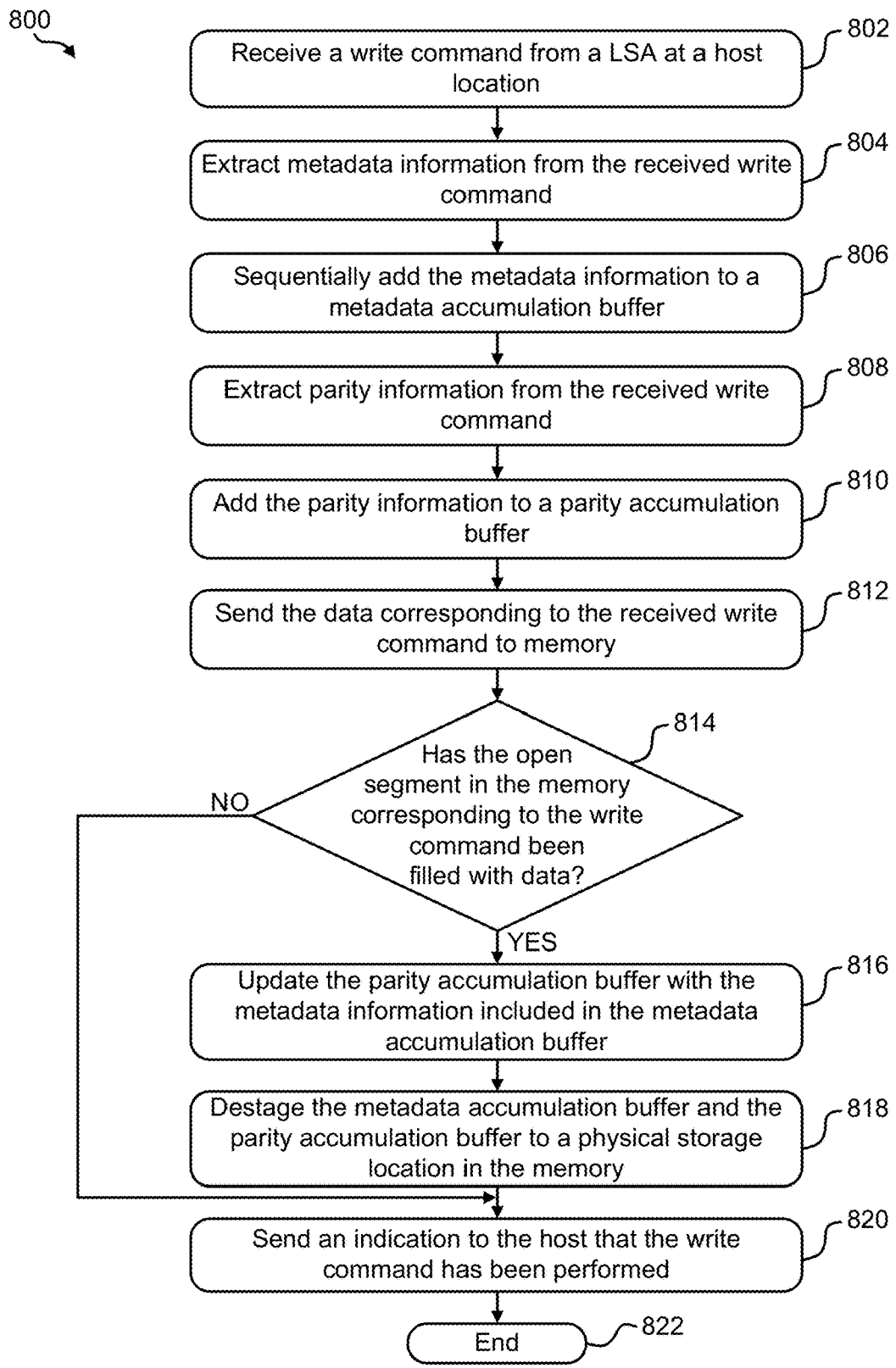
FIG. 8 is a flowchart of a method, in accordance with one embodiment.

The process by which data is received at the I/O controller 706 from the host 702, and ultimately sent to the storage drives 710 in FIGS. 7A-7B may include any one or more of the processes of method 800. As shown in FIG. 8, a flowchart of a method 800 for managing the metadata and parity information corresponding to a LSA array in such a way that achieves durability and persistence of all user write operations is shown according to one embodiment. The method 800 may be performed in accordance with the present invention in any of the environments depicted in FIGS. 1A-7B, among others, in various embodiments. Of course, more or less operations than those specifically described in FIG. 8 may be included in method 800, as would be understood by one of skill in the art upon reading the present descriptions.

Each of the steps of the method 800 may be performed by any suitable component of the operating environment. For example, as mentioned above, any one or more of the processes included in method 800 may be performed by an I/O controller which is in communication with a LSA at a host location as well as memory, e.g., such as I/O controller 706 in FIG. 7A. In various other embodiments, the method 800 may be partially or entirely performed by a controller, a processor, a computer, etc., or some other device having one or more processors therein. Thus, in some embodiments, method 800 may be a computer-implemented method. In such embodiments, the computer used to implement the method may include a storage drive itself or a portion thereof such as the controller, the tape, an external host, a server, etc. Moreover, the terms computer, processor and controller may be used interchangeably with regards to any of the embodiments herein, such components being considered equivalents in the many various permutations of the present invention.

Moreover, for those embodiments having a processor, the processor, e.g., processing circuit(s), chip(s), and/or module(s) implemented in hardware and/or software, and preferably having at least one hardware component may be utilized in any device to perform one or more steps of the method 800. Illustrative processors include, but are not limited to, a central processing unit (CPU), an application specific integrated circuit (ASIC), a field programmable gate array (FPGA), etc., combinations thereof, or any other suitable computing device known in the art.

Operation 802 of method 800 includes receiving a write command (also referred to herein as a "write request") to write data, from a LSA at a host location. Each write request received from the host LSA includes the actual data to be written (e.g., the data associated with the write request), as well as a metadata entry which is associated with that write request. Accordingly, the write request received in operation 802 may include data to be written to memory as well as metadata which corresponds to the data. In some approaches the metadata may include logical block address information, time stamp information, user information which corresponds to the write request, information which identifies a type of data included in the write request, etc., but may include any type of metadata which would be apparent to one skilled in the art after reading the present description.

Moreover, operation 804 includes extracting metadata information from the received write command. The metadata may be extracted from the received write request using any known processes. For instance, in some approaches the write request may identify the metadata using a flag. Once extracted, the metadata information is sequentially added to a metadata accumulation buffer. See operation 806. As described above, a memory space (e.g., a buffer) is preferably allocated for each open segment. Moreover, the allocated memory space may include a header, a parity accumulation buffer, and a metadata accumulation buffer (e.g., see FIG. 7C above). The metadata accumulation buffer may be used to store the metadata corresponding to the write requests received which are directed to the open segment. Accordingly, the extracted metadata information maybe sequentially added to the metadata accumulation buffer using any desired processes.

Referring still to method 800, operation 808 includes extracting parity information from the received write command. According to some approaches, the parity information may be extracted from the write command by actually performing parity computations. The parity computations may be able to achieve fault tolerance by calculating the differences between different versions of data and storing the results. In some approaches, the parity information may be computed by XORing the data included in the received write request, e.g., as would be appreciate by one skilled in the art after reading the present description. According to an illustrative example, which is in no way intended to limit the invention, the parity information may be extracting in operation 808 using a XOR engine which is configured to be compatible with a RAID-5 scheme.

Moreover, operation 810 includes adding the extracted parity information to a parity accumulation buffer. Once again, a memory space (e.g., a buffer) is preferably allocated for each open segment, and may include a header, a parity accumulation buffer, and a metadata accumulation buffer (e.g., see FIG. 7C above). Accordingly, the parity information extracted in operation 808 may be added to the parity accumulation buffer using any desired processes. In an exemplary approach, the extracted parity information may be added to the parity accumulation buffer by combining the extracted parity information with the existing contents of the parity accumulation buffer. For approaches implementing a RAID scheme, e.g., such as RAID-5, the extracted parity information may be combined with the existing contents of the parity accumulation buffer by XOR-ing the previously accumulated (existing) parity information with the new extracted parity information. This XOR-ing operation may be performed using any processes which would be apparent to one skilled in the art after reading the present description. This allows for the parity information being accumulated in the parity accumulation buffer to be updated for the corresponding segment.

The data corresponding to the received write command is also sent to memory. See operation 812. The memory preferably includes a plurality of memory devices (e.g., components) which are configured as an array of memory. Accordingly, operation 812 may include specifying a specific physical storage location and/or a specific storage component in the memory array where the data is to be stored, and subsequently sending the data there. In some approaches, the memory may include an array of Flash-based SSDs which are configured to implement a RAID scheme. Thus, operation 812 may include forwarding the data corresponding to the received write command to the appropriate SSD such that it may be stored thereon. However, in other approaches, the memory may include any desired type(s) of memory.

Operations 804, 806, 808, 810, and 812 are preferably performed in parallel in response to receiving a write request. In other words, data corresponding to a received write command is preferably sent to memory for storage in parallel with extracting parity information from the write request and using it to update a parity accumulation buffer, as well as extracting metadata information from the write request and using it to update a metadata accumulation buffer. According to an exemplary approach, which is in no way intended to limit the invention, operations 804, 806, 808, 810, and 812 may be performed simultaneously and in parallel by an I/O controller which is in communication with the host location as well as the memory (e.g., see 706 in FIG. 7A). Moreover, the parity accumulation buffer and the metadata accumulation buffer may be located in a protected portion of memory in the I/O controller. In other words, the parity accumulation buffer and the metadata accumulation buffer may be stored in non-volatile memory (e.g., such as NVRAM) which is able to retain the data stored therein despite experiencing power loss, a system crash, network connection issues, etc. As a result, both the metadata and the parity information which correspond to a given segment (or RAID stripe) are protected independently of the host location as soon as the write operation is received and processed. Thus, even if the host location crashes, power is lost, a communication link to the host location is severed, etc., the buffers stored in the protected memory at the I/O controller include all of the information involved with either safely destaging the metadata and parity information to the appropriate physical locations in memory, or continuing operation after the host location is restarted and/or in response to another host location assuming control from the failed host location over the LSA function. As a result, data durability (e.g., retention) is significantly increased and the data also becomes highly available. Moreover, these improvements may be achieved in addition to maintaining the advantages provided by a log-structured architecture, e.g., as will be described in further detail below.

Referring still to FIG. 8, decision 814 includes determining whether the open segment in the memory which corresponds to the write command has been filled with data. In other words, decision 814 includes determining whether the open segment has reached capacity. As mentioned above, a segment may be opened (e.g., identified) in memory in response to receiving a write request, and the open segment may be used to store data corresponding to the received write request. However, the amount of data included in the write request received may not align perfectly with the size of the open segment. Thus, in some approaches the data corresponding to a write request may not be able to completely fill the open segment.

Determining whether the open segment has been filled to capacity with data may be performed differently depending on the approach. For instance, in some approaches decision 814 may be determined by an I/O controller which is able to count a number of write requests which have been performed using the open segment. The I/O controller may be able to keep track of the number of write operations which have been performed on the open segment as a result of the process by which data is written to the open segment. Specifically, open segments may be written in a write-append mode. However, in other approaches, decision 814 may be determined in response to receiving an explicit indication from the host location that an open segment has been filled (e.g., completed). In still other approaches, decision 814 may be determined by an I/O controller which maintains a small amount of cache for storing metadata and parity information, whereby the I/O controller simply evicts an entry when new space needs to be made available for a new segment. For instance, a least recently used, oldest, newest, largest, etc. entry in the cache may be evicted to make room for a new segment. Accordingly, the I/O controller may implement a caching policy which is used to manage the small amount of cache included therein.

Open segments which have not yet been filled (e.g., reached capacity) preferably remain in an open state, e.g., such that data corresponding to subsequently received write operations may be stored therein. Moreover, the metadata accumulation buffer and the parity accumulation buffer are preferably not destaged to the stripe until the open stripe has been filled. Accordingly, method 800 is illustrated as skipping operations 816 and 818, jumping to operation 820 in response to determining that the open segment has not been filled with data. There, operation 820 includes sending an indication to the host that the write command has been performed.

However, returning to decision 814, method 800 proceeds to operation 816 in response to determining that the open segment has been filled with data. In other words, method 800 proceeds to operation 816 in response to determining that a portion of the open segment configured to store data corresponding to one or more write requests has been filled to capacity. There, operation 816 includes updating the parity accumulation buffer with the metadata information included in the metadata accumulation buffer. In other words, operation 816 may include updating the parity accumulation buffer to include parity information which protects the metadata included in the metadata accumulation buffer. Accordingly, any one of the approaches described above may be used to update the parity accumulation buffer with additional parity information.

Moving to operation 818, both the metadata information in the metadata accumulation buffer and the parity information in the parity accumulation buffer are destaged to a physical storage location in the memory. As mentioned above, co-locating the metadata with the actual data is preferred as the metadata is updated when data is being relocated upon garbage collection. Accordingly, operation 818 may include destaging both the metadata information in the metadata accumulation buffer and the parity information in the parity accumulation buffer to a physical storage location that is located in the open stripe. However, in some approaches the metadata accumulation buffer and/or the parity accumulation buffer may be stored in dedicated metadata segments. Moreover, it should be noted that while in some approaches the metadata accumulation buffer and the parity accumulation buffer may be destaged to the same physical storage location (e.g., such that the information included in the buffers is collocated), in other approaches the parity accumulation buffer and the metadata accumulation buffer may be destaged to different locations in the open stripe to which they correspond.

Figure 9:
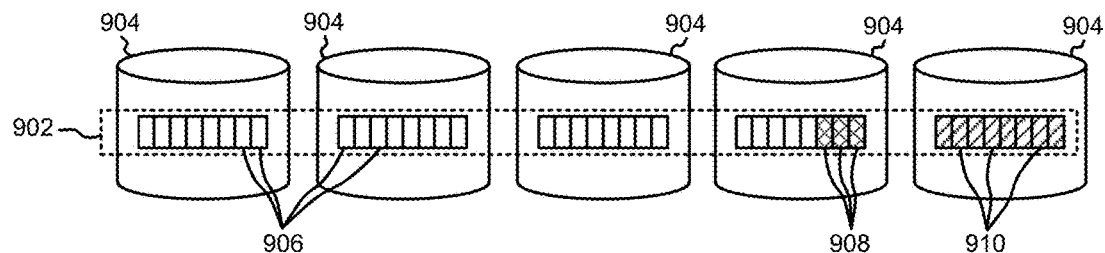
FIG. 9 is a representational view of a plurality of storage drives, in accordance with one embodiment.

Referring momentarily to FIG. 9, a segment 902 spanning across an array of SSDs 904 is illustrated in accordance with one embodiment. According to the present embodiment, the segment 902 may correspond to a single RAID stripe. Moreover, the segment 902 is shown as including data 906, metadata 908, and parity information 910. The pages having metadata 908 stored therein are located at the end of the segment 902 and are grouped together in a contiguous physical space. As a result, the metadata may desirably be read with a single I/O operation from a single SSD. The LPT portion which corresponds to the segment 902 may also be reconstructed with a single I/O operation from a single SSD Similarly, the pages having parity information 910 stored therein are grouped in the rightmost SSD 904. It follows that the metadata accumulation buffer and/or the parity accumulation buffer may be destaged in operation 818 such that the resulting distribution of information in the memory may mirror (or at least be similar) to that shown in FIG. 9.

Returning to FIG. 8, method 800 includes sending an indication to the host that the write command has been performed. See operation 820. Thereafter, the flowchart progresses to operation 822 whereby method 800 may end. However, it should be noted that although method 800 may end upon reaching operation 822, any one or more of the processes included in method 800 may be repeated in order to process additional write requests received. In other words, any one or more of the processes included in method 800 may be repeated for subsequently received write requests.

Although not shown in the flowchart of FIG. 8, a failure condition may be experienced at any point of performing method 800. Thus, in some approaches a failure condition may be experienced before a current write command has actually been performed (e.g., completed). The system implementing the various processes of method 800 and/or specific components included in the system may experience a failure condition as a result of different situations. According to various approaches, a failure condition may be caused by a loss of a power supply, a system crash, corrupt software, a severed network connection, etc. Moreover, these failure conditions may be experienced at the memory location, the I/O controller, the host location, etc.

In response to detecting that a failure condition is about to occur, is currently occurring, has occurred, etc., the metadata information in the metadata accumulation buffer and/or the parity information in the parity accumulation buffer may be used to complete the outstanding write command. As mentioned above, the metadata accumulation buffer and the parity accumulation buffer are preferably stored in protected memory at the I/O controller. Thus, even after a failure condition has occurred, the information included in the metadata and parity accumulation buffers may be unaffected by the failure condition. The information included in the metadata and parity accumulation buffers may be destaged to a given location in memory, whereby the write request may be completed, e.g., as would be appreciated by one skilled in the art after reading the present description.

Figure 10:
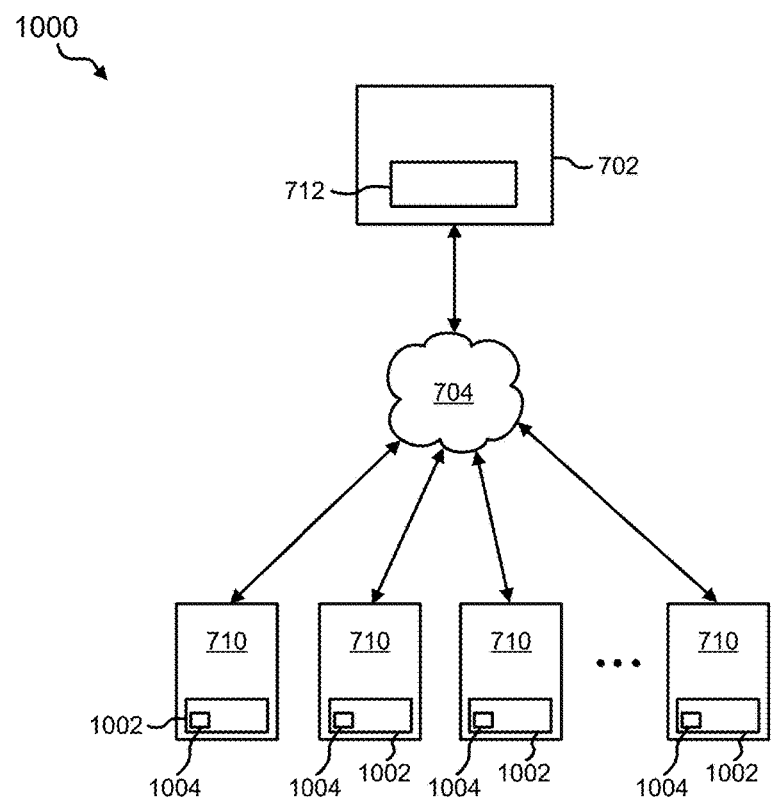
FIG. 10 is a partial representational view of a distributed storage system, in accordance with one embodiment.

Although the storage system 700 illustrated in FIGS. 7A-7C includes a central I/O controller which is coupled to each of the storage drives 710, a storage system may have a distributed configuration in some approaches. For instance, referring momentarily to FIG. 10, a storage system 1000 having a distributed architecture is illustrated in accordance with one embodiment. As an option, the present storage system 1000 may be implemented in conjunction with features from any other embodiment listed herein, such as those described with reference to the other FIGS. Specifically, FIG. 10 illustrates variations of the embodiment of FIGS. 7A-7C having several exemplary configurations within a distributed storage system 1000. Accordingly, various components of FIG. 10 have common numbering with those of FIGS. 7A-7C.

However, such storage system 1000 and others presented herein may be used in various applications and/or in permutations which may or may not be specifically described in the illustrative embodiments listed herein. Further, the storage system 1000 presented herein may be used in any desired environment. Thus FIG. 10 (and the other FIGS.) may be deemed to include any possible permutation.

As shown, the storage system 1000 includes a host 702 which is coupled to a plurality of storage drives 710 by a network 704, e.g., according to any of the approaches described above. Moreover, the host 702 includes a LSA component 712. Looking to the plurality of storage drives 710, each of the storage drives 710 includes an I/O controller 1002 included therein. Each of the I/O controllers 1002 also include a relatively small amount of protected memory 1004, e.g., such as a battery-backed DRAM, or other types of NVRAM as described above. Accordingly, each of the storage drives 710 may be able to process requests, commands, instructions, etc. received from the host 702.

Due to the distributed nature of the storage system 1000, the I/O controllers 1002 in the various storage drives 710 may be able to communicate directly with each other, e.g., using the network 704. Each of the I/O controllers 1002 may also be able to maintain a metadata accumulation buffer and/or a parity accumulation buffer therein. In some approaches, a write request received from the host 702 may be distributed by the network 704 such that each portion of the writ request is delivered to the I/O controllers 1002 in the storage drive 710 which corresponds to the intended storage location of the data in the respective portion. In other approaches, portions of a write request received from the host 702 may be distributed to the various I/O controllers 1002 in an arbitrary manner. Thereafter, the various I/O controllers 1002 may communicate with each other such that each portion of the write request is delivered to the I/O controller 1002 in the storage drive 710 which corresponds to the intended storage location of the data in the respective portion. It follows that any one or more of the processes included in method 800 may be performed by each of the I/O controllers 1002, one of the I/O controllers 1002 which has been designated as a managing controller, subsets of the I/O controllers 1002, etc., depending on the desired approach.

It follows that various embodiments included herein are able to improve performance, while also increasing data retention and security. As described above, these improvements may be achieved by transferring at least a portion of the data processing functionality to the host location and/or other components in the storage system, e.g., such as an I/O controller. Moreover, the improvements to data durability and availability may be achieved in addition to maintaining the advantages provided by a log-structured architecture. For instance, log-structured architectures store metadata together with the data at a well-known location. As a result, the parity information may not even be updated on the memory, even under workloads with small random write operations despite the fact that the LSA organization of data, metadata, and parity information may be performed by the host.

Again, various embodiments included herein are able to achieve an efficient and accurate management of metadata and parity information for LSA data arrays such that durability and persistence of all user write operations is achieved. These improvements may be achieved as a result of implementing an I/O controller which is equipped with a small amount of protected memory (e.g., NVRAM). This protected memory may be allocated for each LSA segment, and used to incrementally accumulate the parity information for the RAID stripe that corresponds to that segment, while also incrementally accumulating the metadata entries which corresponding to that LSA segment. The embodiments included herein may even achieve data durability in the presence of arbitrary host failures, as well as erasure coding without parity updates (i.e., no Read-Modify-Writes for RAID5 or RAID6, even in the presence of small user writes). Moreover, these improvements are achieved while also implementing sequential write patterns for each of the respective LSA segments, as well as the ability to group all the metadata pages for the LSA segment contiguously in the physical space.

Alternative embodiments may also implement the I/O controllers and/or protected memory inside each of the storage drives themselves, e.g., in a distributed fashion as described above. This allows the storage controller to maintain an implicit or explicit mapping on which parity information and metadata are to be placed for each stripe. Preferably, parity information and/or metadata are placed in the protected memory of the storage drive on which the strip is going to be written (e.g., destaged) once the segment has been fully written (e.g., see operation 818 above).

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Moreover, a system according to various embodiments may include a processor and logic integrated with and/or executable by the processor, the logic being configured to perform one or more of the process steps recited herein. By integrated with, what is meant is that the processor has logic embedded therewith as hardware logic, such as an application specific integrated circuit (ASIC), a field programmable gate array (FPGA), etc. By executable by the processor, what is meant is that the logic is hardware logic; software logic such as firmware, part of an operating system, part of an application program; etc., or some combination of hardware and software logic that is accessible by the processor and configured to cause the processor to perform some functionality upon execution by the processor. Software logic may be stored on local and/or remote memory of any memory type, as known in the art. Any processor known in the art may be used, such as a software processor module and/or a hardware processor such as an ASIC, a FPGA, a central processing unit (CPU), an integrated circuit (IC), a graphics processing unit (GPU), etc.

It will be clear that the various features of the foregoing systems and/or methodologies may be combined in any way, creating a plurality of combinations from the descriptions presented above.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

Figure 11:
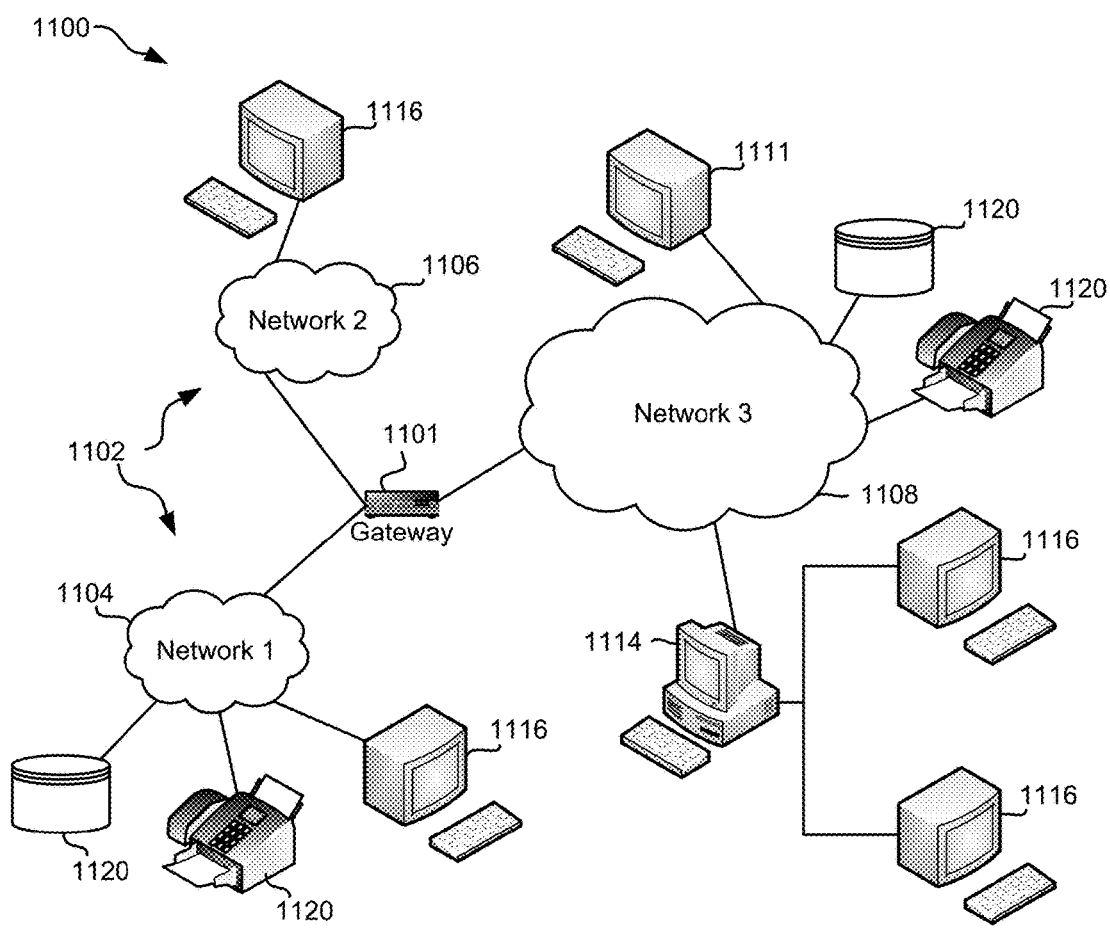
FIG. 11 is a network architecture, in accordance with one embodiment.

FIG. 11 illustrates a network architecture 1100, in accordance with one embodiment. As shown in FIG. 11, a plurality of remote networks 1102 are provided including a first remote network 1104 and a second remote network 1106. A gateway 1101 may be coupled between the remote networks 1102 and a proximate network 1108. In the context of the present network architecture 1100, the networks 1104, 1106 may each take any form including, but not limited to a LAN, a WAN such as the Internet, public switched telephone network (PSTN), internal telephone network, etc.

In use, the gateway 1101 serves as an entrance point from the remote networks 1102 to the proximate network 1108. As such, the gateway 1101 may function as a router, which is capable of directing a given packet of data that arrives at the gateway 1101, and a switch, which furnishes the actual path in and out of the gateway 1101 for a given packet.

Further included is at least one data server 1114 coupled to the proximate network 1108, and which is accessible from the remote networks 1102 via the gateway 1101. It should be noted that the data server(s) 1114 may include any type of computing device/groupware. Coupled to each data server 1114 is a plurality of user devices 1116. Such user devices 1116 may include a desktop computer, laptop computer, handheld computer, printer, and/or any other type of logic-containing device. It should be noted that a user device 1111 may also be directly coupled to any of the networks, in some embodiments.

A peripheral 1120 or series of peripherals 1120, e.g., facsimile machines, printers, scanners, hard disk drives, networked and/or local data storage units or systems, etc., may be coupled to one or more of the networks 1104, 1106, 1108. It should be noted that databases and/or additional components may be utilized with, or integrated into, any type of network element coupled to the networks 1104, 1106, 1108. In the context of the present description, a network element may refer to any component of a network.

According to some embodiments, methods and systems described herein may be implemented with and/or on virtual systems and/or systems which emulate one or more other systems, such as a UNIX system which virtually hosts a MICROSOFT WINDOWS environment, etc. This virtualization and/or emulation may be enhanced through the use of VMWARE software, in some embodiments.

In other embodiments, one or more networks 1104, 1106, 1108, may represent a cluster of systems commonly referred to as a "cloud." In cloud computing, shared resources, such as processing power, peripherals, software, data, servers, etc., are provided to any system in the cloud in an on-demand relationship, thereby allowing access and distribution of services across many computing systems. Cloud computing typically involves an Internet connection between the systems operating in the cloud, but other techniques of connecting the systems may also be used, as known in the art.

Figure 12:
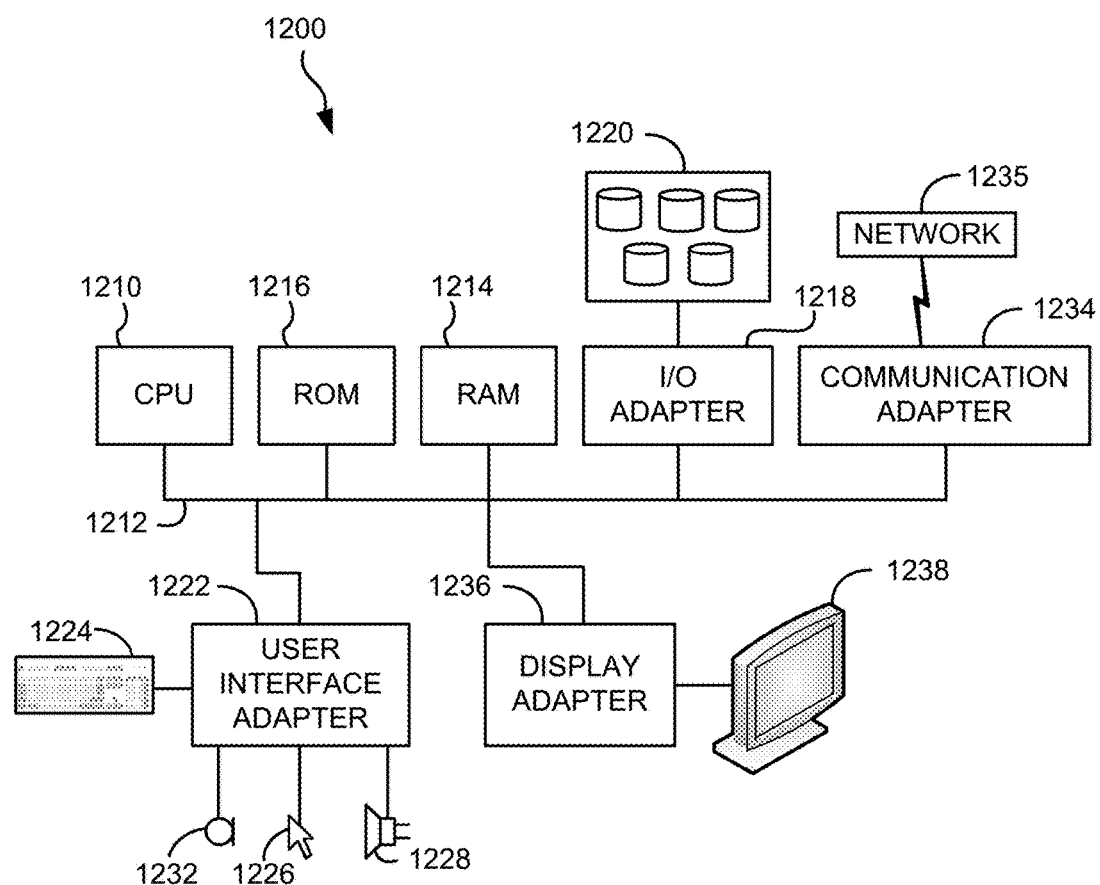
FIG. 12 is a representative hardware environment that may be associated with the servers and/or clients of FIG. 11, in accordance with one embodiment.

FIG. 12 shows a representative hardware environment associated with a user device 1116 and/or server 1114 of FIG. 11, in accordance with one embodiment. FIG. 12 illustrates a typical hardware configuration of a processor system 1200 having a central processing unit 1210, such as a microprocessor, and a number of other units interconnected via a system bus 1212, according to one embodiment. In some embodiments, central processing unit 1210 may include any of the approaches described above with reference to the one or more processors 210 of FIG. 2.

The processor system 1200 shown in FIG. 12 includes a Random Access Memory (RAM) 1214, Read Only Memory (ROM) 1216, and an I/O adapter 1218. According to some embodiments, which are in no way intended to limit the invention, I/O adapter 1218 may include any of the approaches described above with reference to I/O adapter 218 of FIG. 2. Referring still to processor system 1200 of FIG. 12, the aforementioned components 1214, 1216, 1218 may be used for connecting peripheral devices such as storage subsystem 1220 to the bus 1212. In some embodiments, storage subsystem 1220 may include a similar and/or the same configuration as data storage system 220 of FIG. 2. According to an example, which is in no way intended to limit the invention, storage subsystem 1220 may include non-volatile data storage cards, e.g., having NVRAM memory cards, RAM, ROM, and/or some other known type of non-volatile memory, in addition to RAID controllers as illustrated in FIG. 2.

With continued reference to FIG. 12, a user interface adapter 1222 for connecting a keyboard 1224, a mouse 1226, a speaker 1228, a microphone 1232, and/or other user interface devices such as a touch screen, a digital camera (not shown), etc., to the bus 1212.

Processor system 1200 further includes a communication adapter 1234 which connects the processor system 1200 to a communication network 1235 (e.g., a data processing network) and a display adapter 1236 which connects the bus 1212 to a display device 1238.

The processor system 1200 may have resident thereon an operating system such as the MICROSOFT WINDOWS Operating System (OS), a MAC OS, a UNIX OS, etc. It will be appreciated that a preferred embodiment may also be implemented on platforms and operating systems other than those mentioned. A preferred embodiment may be written using JAVA, XML, C, and/or C++ language, or other programming languages, along with an object oriented programming methodology. Object oriented programming (OOP), which has become increasingly used to develop complex applications, may be used.

Figure 13:
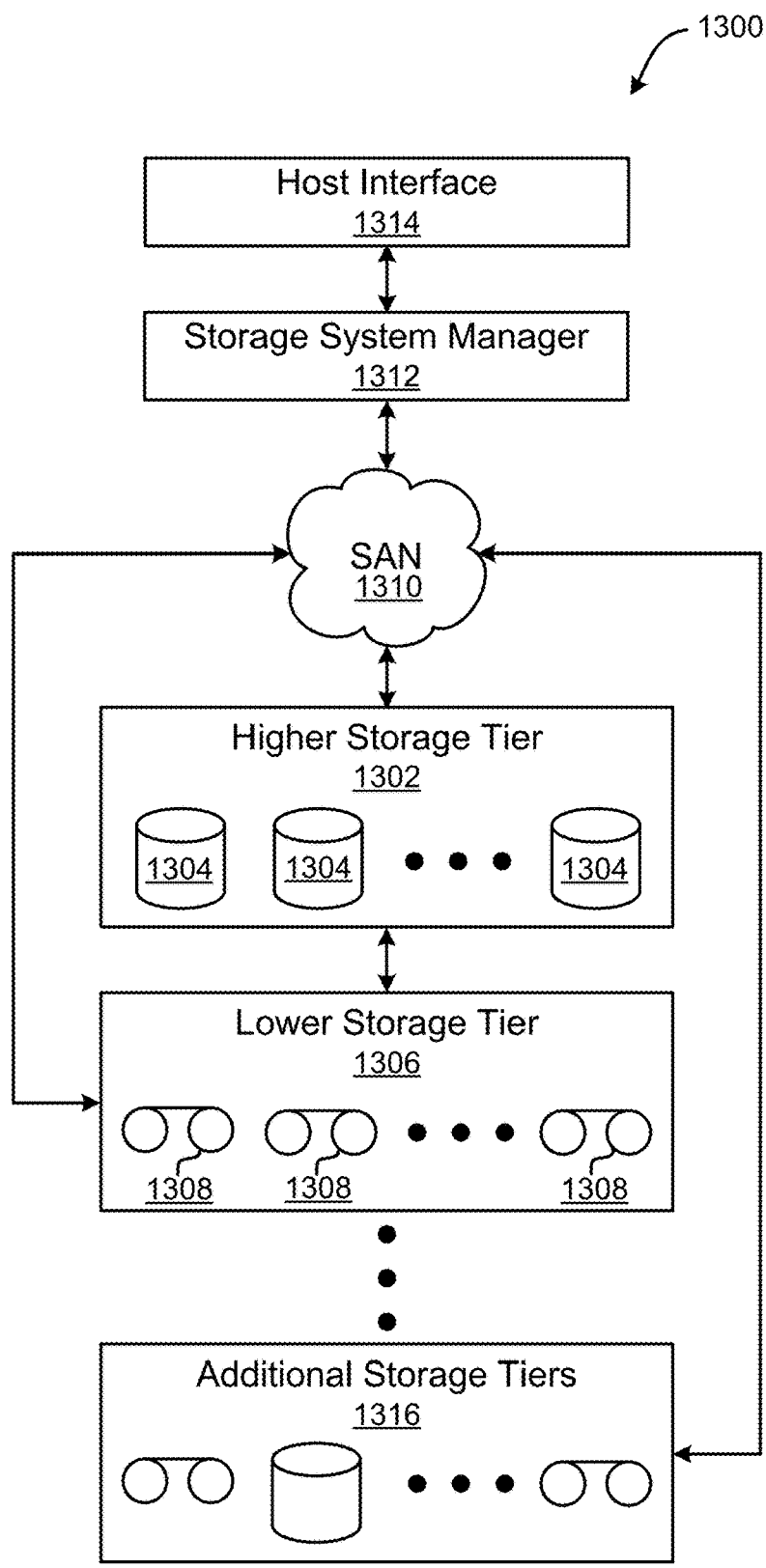
FIG. 13 is a tiered data storage system in accordance with one embodiment.

Moreover, FIG. 13 illustrates a storage system 1300 which implements high level (e.g., SSD) storage tiers in combination with lower level (e.g., magnetic tape) storage tiers, according to one embodiment. Note that some of the elements shown in FIG. 13 may be implemented as hardware and/or software, according to various embodiments. The storage system 1300 may include a storage system manager 1312 for communicating with a plurality of media on at least one higher storage tier 1302 and at least one lower storage tier 1306. However, in other approaches, a storage system manager 1312 may communicate with a plurality of media on at least one higher storage tier 1302, but no lower storage tier. The higher storage tier(s) 1302 preferably may include one or more random access and/or direct access media 1304, such as hard disks, nonvolatile memory (NVM), NVRAM), solid state memory in SSDs, flash memory, SSD arrays, flash memory arrays, etc., and/or others noted herein or known in the art. According to illustrative examples, FIGS. 3-4 show exemplary architectures of SSD systems which may be used as a higher storage tier 1302 depending on the desired embodiment.

Referring still to FIG. 13, the lower storage tier(s) 1306 preferably includes one or more lower performing storage media 1308, including sequential access media such as magnetic tape in tape drives and/or optical media, slower accessing HDDs, slower accessing SSDs, etc., and/or others noted herein or known in the art. One or more additional storage tiers 1316 may include any combination of storage memory media as desired by a designer of the system 1300. Thus, the one or more additional storage tiers 1316 may, in some approaches, include a SSD system architecture similar or the same as those illustrated in FIGS. 1-2. Also, any of the higher storage tiers 1302 and/or the lower storage tiers 1306 may include any combination of storage devices and/or storage media.

The storage system manager 1312 may communicate with the storage media 1304, 1308 on the higher storage tier(s) 1302 and lower storage tier(s) 1306 through a network 1310, such as a storage area network (SAN), as shown in FIG. 13, or some other suitable network type. The storage system manager 1312 may also communicate with one or more host systems (not shown) through a host interface 1314, which may or may not be a part of the storage system manager 1312. The storage system manager 1312 and/or any other component of the storage system 1300 may be implemented in hardware and/or software, and may make use of a processor (not shown) for executing commands of a type known in the art, such as a central processing unit (CPU), a field programmable gate array (FPGA), an application specific integrated circuit (ASIC), etc. Of course, any arrangement of a storage system may be used, as will be apparent to those of skill in the art upon reading the present description.

In more embodiments, the storage system 1300 may include any number of data storage tiers, and may include the same or different storage memory media within each storage tier. For example, each data storage tier may include the same type of storage memory media, such as HDDs, SSDs, sequential access media (tape in tape drives, optical disk in optical disk drives, etc.), direct access media (CD-ROM, DVD-ROM, etc.), or any combination of media storage types. In one such configuration, a higher storage tier 1302, may include a majority of SSD storage media for storing data in a higher performing storage environment, and remaining storage tiers, including lower storage tier 1306 and additional storage tiers 1316 may include any combination of SSDs, HDDs, tape drives, etc., for storing data in a lower performing storage environment. In this way, more frequently accessed data, data having a higher priority, data needing to be accessed more quickly, etc., may be stored to the higher storage tier 1302, while data not having one of these attributes may be stored to the additional storage tiers 1316, including lower storage tier 1306. Of course, one of skill in the art, upon reading the present descriptions, may devise many other combinations of storage media types to implement into different storage schemes, according to the embodiments presented herein.

According to some embodiments, the storage system (such as 1300) may include logic configured to receive a request to open a data set, logic configured to determine if the requested data set is stored to a lower storage tier 1306 of a tiered data storage system 1300 in multiple associated portions, logic configured to move each associated portion of the requested data set to a higher storage tier 1302 of the tiered data storage system 1300, and logic configured to assemble the requested data set on the higher storage tier 1302 of the tiered data storage system 1300 from the associated portions.

Of course, this logic may be implemented as a method on any device and/or system or as a computer program product, according to various embodiments.

What is claimed is:

1. A computer-implemented method, comprising:
receiving a write command to write data, wherein the write command is received from a log structure array at a host location;
extracting metadata information from the received write command;
sequentially adding the extracted metadata information to a metadata buffer;
extracting parity information from the received write command;
adding the extracted parity information to a parity buffer;
sending the data corresponding to the received write command to a memory;
determining whether an open segment in the memory which corresponds to the write command has been filled;
updating the parity buffer with the metadata information included in the metadata buffer in response to determining that the open segment has been filled; and
destaging the metadata information from the metadata buffer and parity information from the parity buffer to a physical storage location in the memory.

2. The computer-implemented method of claim 1, wherein the memory includes one or more solid state drives.

3. The computer-implemented method of claim 1, wherein the open segment corresponds to one or more RAID stripes.

4. The computer-implemented method of claim 1, wherein the method is performed by an input/output controller, wherein the input/output controller is in communication with the log structure array at the host location, wherein the input/output controller is in communication with the memory.

5. The computer-implemented method of claim 4, wherein the input/output controller includes a non-volatile random access memory, wherein the metadata buffer and the parity buffer are stored in the non-volatile random access memory.

6. The computer-implemented method of claim 1, wherein the metadata buffer and the parity buffer are stored in a non-volatile random access memory.

7. The computer-implemented method of claim 1, wherein sequentially adding the extracted metadata information to the metadata buffer, adding the extracted parity information to the parity buffer, and sending the data corresponding to the received write command to a memory, are performed in parallel.

8. The computer-implemented method of claim 1, comprising:
sending an indication to the host that the write command has been performed in response to determining that the open segment has not been filled; and
using the metadata information in the metadata buffer and the parity information in the parity buffer to complete the write command in response to experiencing a failure condition before the write command has been performed.

9. A computer program product comprising a computer readable storage medium having program instructions embodied therewith, wherein the computer readable storage medium is not a transitory signal per se, the program instructions readable and/or executable by a processor to cause the processor to perform a method comprising:
receiving, by the processor, a write command to write data, wherein the write command is received from a log structure array at a host location;
extracting, by the processor, metadata information from the received write command;
sequentially adding, by the processor, the extracted metadata information to a metadata buffer;
extracting, by the processor, parity information from the received write command;
adding, by the processor, the extracted parity information to a parity buffer;
sending, by the processor, the data corresponding to the received write command to a memory;
determining, by the processor, whether an open segment in the memory which corresponds to the write command has been filled;
updating, by the processor, the parity buffer with the metadata information included in the metadata buffer in response to determining that the open segment has been filled; and
destaging, by the processor, the metadata information from the metadata buffer and the parity information from the parity buffer to a physical storage location in the memory.

10. The computer program product of claim 9, wherein the memory includes one or more solid state drives.

11. The computer program product of claim 9, wherein the method is performed by an input/output controller, wherein the input/output controller is in communication with the log structure array at the host location, wherein the input/output controller is in communication with the memory.

12. The computer program product of claim 11, wherein the input/output controller includes a non-volatile random access memory, wherein the metadata buffer and the parity buffer are stored in the non-volatile random access memory.

13. The computer program product of claim 9, wherein the metadata buffer and the parity buffer are stored in a non-volatile random access memory.

14. The computer program product of claim 9, wherein sequentially adding the extracted metadata information to the metadata buffer, adding the extracted parity information to the parity buffer, and sending the data corresponding to the received write command to a memory, are performed in parallel.

15. The computer program product of claim 9, wherein the program instructions are readable and/or executable by the processor to cause the processor to perform the method comprising:
sending, by the processor, an indication to the host that the write command has been performed in response to determining that the open segment has not been filled; and
using, by the processor, the metadata information in the metadata buffer and the parity information in the parity buffer to complete the write command in response to experiencing a failure condition before the write command has been performed.

16. A system, comprising:

an input/output controller; and logic integrated with and/or executable by the input/output controller, the logic being configured to cause the input/output controller to:
- receive, by the input/output controller, a write command to write data, wherein the write command is received from a log structure array at a host location;
- extract, by the input/output controller, metadata information from the received write command;
- sequentially add, by the input/output controller, the extracted metadata information to a metadata buffer;
- extract, by the input/output controller, parity information from the received write command;
- add, by the input/output controller, the extracted parity information to a parity buffer;
- send, by the input/output controller, the data corresponding to the received write command to a memory;
- determine, by the input/output controller, whether an open segment in the memory which corresponds to the write command has been filled;
- update, by the input/output controller, the parity buffer with the metadata information included in the metadata buffer in response to determining that the open segment has been filled; and
- destage, by the input/output controller, the metadata information from the metadata buffer and the parity information from the parity buffer to a physical storage location in the memory.

17. The system of claim 16, wherein the memory includes one or more solid state drives, wherein the input/output controller is in communication with the log structure array at the host location, wherein the input/output controller is in communication with the one or more solid state drives.

18. The system of claim 16, wherein the input/output controller includes a non-volatile random access memory, wherein the metadata buffer and the parity buffer are stored in the non-volatile random access memory.

19. The system of claim 16, wherein sequentially adding the extracted metadata information to the metadata buffer, adding the extracted parity information to the parity buffer, and sending the data corresponding to the received write command to a memory, are performed in parallel.

20. The system of claim 16, the logic being configured to cause the input/output controller to:
- send, by the input/output controller, an indication to the host that the write command has been performed in response to determining that the open segment has not been filled; and
- use, by the input/output controller, the metadata information in the metadata buffer and the parity information in the parity buffer to complete the write command in response to experiencing a failure condition before the write command has been performed.

\* \* \* \* \*